United States Patent
Shim et al.

(10) Patent No.: US 11,609,813 B2
(45) Date of Patent: Mar. 21, 2023

(54) MEMORY SYSTEM FOR SELECTING COUNTER-ERROR OPERATION THROUGH ERROR ANALYSIS AND DATA PROCESS SYSTEM INCLUDING THE SAME

(71) Applicant: SK hynix Inc., Gyeonggi-do (KR)

(72) Inventors: Eung Bo Shim, Gyeonggi-do (KR); Nam Young Ahn, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 260 days.

(21) Appl. No.: 16/923,819

(22) Filed: Jul. 8, 2020

(65) Prior Publication Data

US 2021/0208966 A1 Jul. 8, 2021

(30) Foreign Application Priority Data

Jan. 7, 2020 (KR) .................. 10-2020-0001998

(51) Int. Cl.
  *G06F 11/10* (2006.01)
  *G06F 11/07* (2006.01)
  (Continued)

(52) U.S. Cl.
  CPC ........ *G06F 11/1068* (2013.01); *G06F 11/079* (2013.01); *G06F 11/0787* (2013.01);
  (Continued)

(58) Field of Classification Search
  CPC .............. G06F 11/079; G06F 11/0793; G06F 11/1068; G06F 11/0787; G06F 11/3037
  See application file for complete search history.

(56) References Cited

U.S. PATENT DOCUMENTS

2014/0245105 A1\* 8/2014 Chung ................. G06F 3/0604
                                                          714/763
2015/0347229 A1\* 12/2015 Higgins ............... G11C 29/025
                                                          714/764
(Continued)

FOREIGN PATENT DOCUMENTS

KR    10-2016-0144560    12/2016
KR    10-2017-0142841    12/2017
KR       10-1941105        1/2019

OTHER PUBLICATIONS

Schroeder et al., DRAM Errors in the Wild: A Large-Scale Field Study, SIGMETRICS '09, Jun. 2009, pp. 193-204, ACM, New York, USA.

(Continued)

*Primary Examiner* — Jigar P Patel
(74) *Attorney, Agent, or Firm* — IP & T Group LLP

(57) ABSTRACT

A data processing system comprising: a memory system comprising a plurality of memory devices, each of which comprises a first error correction unit and a plurality of cell array regions each having a plurality of memory cells coupled in an array to a plurality of word lines and a plurality of bit lines; and a host comprising a second error correction unit for correcting an error of data transferred from the memory system, and suitable for generating error correction information on the error correction operation of the second error correction unit, setting error correcting strengths to the respective memory devices using the error correction information and log information, and performing counter-error operations on the respective memory devices according to the error correcting strengths.

19 Claims, 8 Drawing Sheets

(51) Int. Cl.
*G06F 11/30* (2006.01)
*G11C 29/44* (2006.01)
*G11C 29/12* (2006.01)

(52) U.S. Cl.
CPC ...... *G06F 11/0793* (2013.01); *G06F 11/3037* (2013.01); *G11C 29/44* (2013.01); *G11C 2029/1202* (2013.01); *G11C 2029/1204* (2013.01)

(56) References Cited

U.S. PATENT DOCUMENTS

2019/0019569 A1* 1/2019 Pope ................ G11C 29/44
2019/0188589 A1* 6/2019 Ponnuru ............. G11C 7/04
2019/0361773 A1* 11/2019 Berke ............. G06F 11/1076

OTHER PUBLICATIONS

Intel Technologies, Second Generation Intel® Xeon® Scalable Processors, Datasheet, vol. Two: Registers, Apr. 2019, pp. 1-60, Intel, Santa Clara, USA.

* cited by examiner

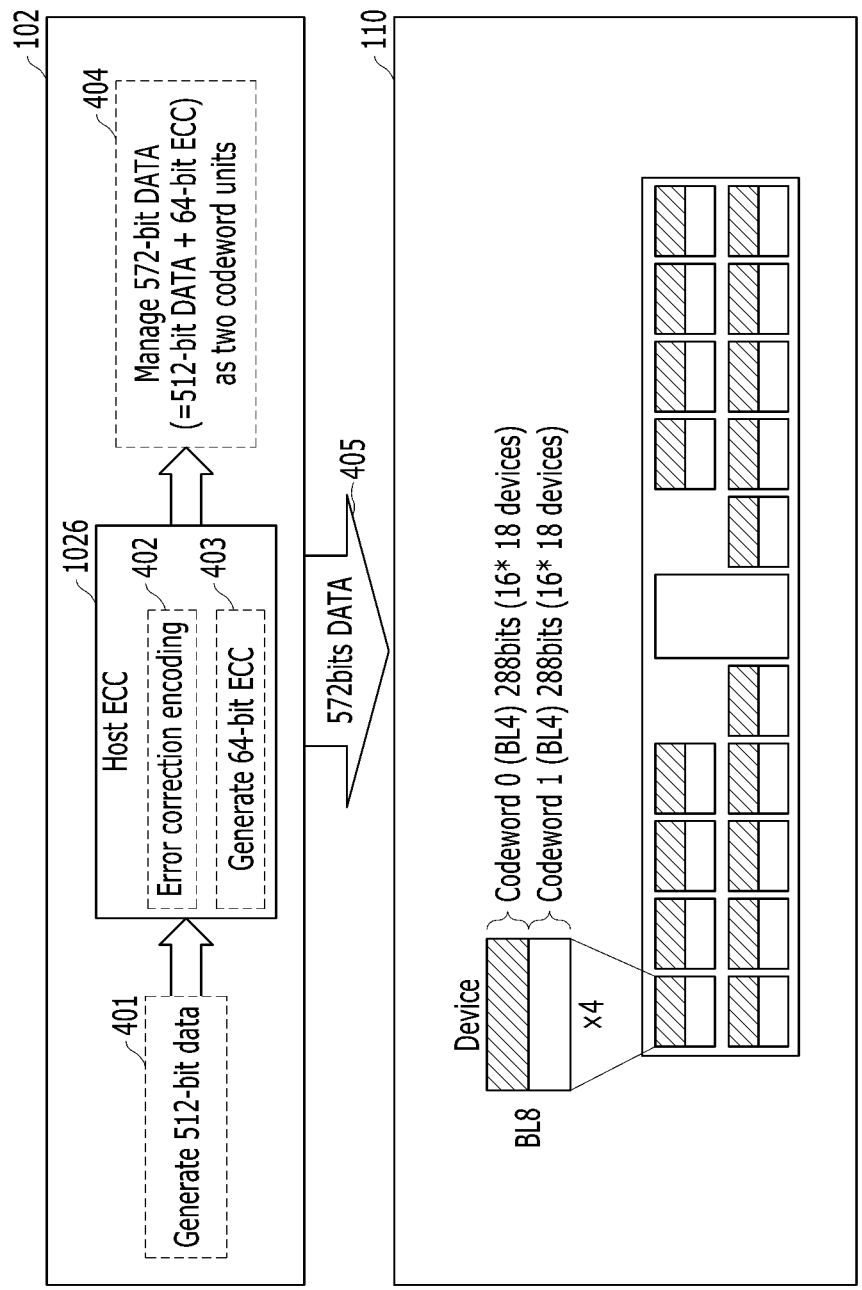

MEMORY SYSTEM FOR SELECTING COUNTER-ERROR OPERATION THROUGH ERROR ANALYSIS AND DATA PROCESS SYSTEM INCLUDING THE SAME

CROSS-REFERENCE TO RELATED APPLICATION

This application claims priority under 35 U.S.C. § 119 to Korean Patent Application No. 10-2020-0001998, filed on Jan. 7, 2020, which is incorporated herein by reference in its entirety.

BACKGROUND

1. Field

Various embodiments relate to a data processing system, and more particularly, to a memory system capable of selecting a counter-error operation through error analysis and a data processing system including the same.

2. Discussion of the Related Art

Computing devices or wired/wireless electronic devices, for example, computing devices such as a server, desktop computer and laptop computer or electronic devices such as a mobile phone, game machine, TV and projector may generate and process much data during an operation process. In order to store the data generated and processed during the operation process, a memory system using a memory device, i.e., a data storage device, may be generally used. The data storage device may be used as a main memory device or auxiliary memory device of a computing device or an electronic device.

The memory system may include a plurality of memory devices, and an error may occur while some data are not normally written/read during a process of writing/reading data to/from the plurality of memory devices. In general, most data in which errors occurred can be corrected through an algorithm for recovering errors. However, a serious error which cannot be corrected even by such algorithm may occur. When such a serious error occurs, the reliability of the entire memory system may be significantly degraded.

Therefore, it is advantageous to be able to predict when and where a serious error will occur. In the related art, however, error prediction has been performed according to a statistical method using an operation of counting the number of occurring errors. Thus, the accuracy of the prediction is significantly degraded.

SUMMARY

Various embodiments are directed to a data processing system including a device and method capable of performing counter-error operations on a plurality of memory devices by analyzing errors which previously occurred in a memory system including a plurality of memory devices.

In an embodiment, a data processing system may include: a memory system comprising a plurality of memory devices, each of which comprises a first error correction unit and a plurality of cell array regions each having a plurality of memory cells coupled in an array to a plurality of word lines and a plurality of bit lines; and a host comprising a second error correction unit for correcting an error of data transferred from the memory system, and suitable for generating error correction information on the error correction operation of the second error correction unit, setting error correcting strengths to the respective memory devices using the error correction information and log information generated by the memory devices, and performing counter-error operations on the respective memory devices according to the error correcting strengths. Errors occurring in data accessed through access operations on the plurality of cell array regions may be corrected by the first error correction unit. Each of the memory devices may generate the log information on the error correction operation of the first error correction unit.

Each of the memory devices may generate the log information by accumulating and storing error information of the data corrected by the first error correction unit in an information storage area therein. Each of the memory devices may output the log information to the host through the memory system according to a request of the host.

The host may include: an error information collection unit suitable for collecting the error correction information in real time or at set time points, and collecting the log information from the memory system at the set time points; a first error analysis unit suitable for analyzing the log information and the error correction information, checking numbers and types of errors occurring in the respective memory devices, and deciding error ranks of the respective memory devices according to the check result; a second error analysis unit suitable for deciding error correcting strengths for some of the plurality of memory devices according to the error ranks by checking forms and the numbers of the errors through additional analysis of the log information and the error correction information, and deciding the error correcting strengths for remaining memory devices such that the error correcting strengths for the remaining memory devices correspond to the error ranks; and a counter-error operation unit suitable for performing the counter-error operations on the respective memory devices according to the error correcting strengths.

The first error analysis unit may classify, as a first memory device, a memory device in which the number of errors occurring therein is equal to or more than a first reference number among the plurality of memory devices. When the type of the errors occurring in the first memory device is a first error occurring in word lines equal to or more than a second reference number, the first error analysis unit may classify the first memory device as a second memory device having a first error rank. When the type of the errors occurring in the first memory device is a different type of error from the first error, the first error analysis unit may classify the corresponding first memory device as a third memory device having a second error rank.

Each of the first and second error correction units may perform an error correction operation on data, inputted to/outputted from each of the memory devices, in codeword units including an Error Correction Code (ECC). When the errors occurring in the second memory device are across the codeword units, a number of which is equal to or more than a third reference number, and a total number of error bits contained in the errors is equal to or more than a fourth reference number, the second error analysis unit may classify the corresponding second memory device as a fourth memory device having a first error correcting strength. When the errors occurring in the second memory device are across the codeword units, the number of which is equal to or more than the third reference number, and the total number of error bits contained in the errors is less than the fourth reference number or the errors are across the codeword units, the number of which is less than the third reference number, the second error analysis unit may classify the corresponding second memory device as a fifth memory device having a second error correcting strength. The second error analysis unit may classify the third memory device as the fifth memory device by assigning the second error correcting strength to the third memory device.

The counter-error operation unit may select, as the counter-error operation, any one of: an operation of selecting and blocking access to an area where the errors occurred in the fourth memory device, an operation of selecting and repairing the area where the errors occurred in the fourth memory device, and an operation of selecting and disabling the area where the errors occurred in the fourth memory device, according to the state of the fourth memory device. The counter-error operation unit may perform the selected operation.

The host may select and performs any one of: an operation of designating, as the set time points, time points spaced apart by a specific time interval starting from when power is supplied to the memory system, an operation of counting the number of the errors occurring in the data during the access operations on the memory system, designating, as the set time points, each time point at which the counted number exceeds a fifth reference number, and an operation of designating, as the set time points, each time point at which the time required for correcting the errors in the data accessed through the access operations is equal to or longer than a specific time.

In an embodiment, a memory system may include: a plurality of memory devices each comprising a first error correction unit and a plurality of cell array regions each having a plurality of memory cells coupled in an array to a plurality of word lines and a plurality of bit lines, and suitable for correcting errors occurring in data accessed through access operations on the plurality of cell array regions through the first error correction unit, and generating log information on the error correction operation of the first error correction unit; and a controller comprising a second error correction unit for correcting errors of data transferred from the plurality of memory devices, and suitable for generating error correction information on the error correction operation of the second error correction unit, setting error correcting strengths to the respective memory devices using the log information and the error correction information, and performing counter-error operations on the respective memory devices according to the error correcting strengths.

Each of the memory devices may generate the log information by accumulating and storing error information of the data corrected by the first error correction unit in an information storage area therein. Each of the memory devices may output the log information to the controller according to a request of the controller.

The controller may include: an error information collection unit suitable for collecting the error correction information in real time or at set time points, and collecting the log information from each of the memory devices at the set time points; a first error analysis unit suitable for analyzing the log information and the error correction information, checking numbers and types of errors occurring in the respective memory devices, and deciding error ranks of the respective memory devices according to the check result; a second error analysis unit suitable for deciding error correcting strengths for some of the plurality of memory devices according to the error ranks by checking forms and the numbers of the errors through additional analysis of the log information and the error correction information, and deciding the error correcting strengths for remaining memory devices such that the error correcting strengths for the remaining memory devices correspond to the error ranks; and a counter-error operation unit suitable for performing the counter-error operations on the respective memory devices according to the error correcting strengths.

The first error analysis unit may classify, as a first memory device, a memory device in which the number of errors occurring therein is equal to or more than a first reference number, among the plurality of memory devices. When the type of the errors occurring in the first memory device is a first error occurring in word lines equal to or more than a second reference number, the first error analysis unit may classify the corresponding first memory device as a second memory device having a first error rank. When the type of the errors occurring in the first memory device is a different type of error from the first error, the first error analysis unit may classify the corresponding first memory device as a third memory device having a second error rank.

Each of the first and second error correction units may perform an error correction operation on data, inputted to/outputted from each of the memory devices, in codeword units including an Error Correction Code (ECC). When errors occurring in the second memory device are across the codeword units, a number of which is equal to or more than a third reference number, and a total number of error bits contained in the errors is equal to or more than a fourth reference number, the second error analysis unit may classify the corresponding second memory device as a fourth memory device having a first error correcting strength. When the errors occurring in the second memory device are across the codeword units, the number of which is equal to or more than the third reference number, and the total number of error bits contained in the errors is less than the fourth reference number or the errors are across the codeword units, the number of which is less than the third reference number, the second error analysis unit may classify the corresponding second memory device as a fifth memory device having a second error correcting strength. The second error analysis unit may classify the third memory device as the fifth memory device by assigning the second error correcting strength to the third memory device.

The counter-error operation unit may select, as the counter-error operation, any one of: an operation of selecting and blocking access to an area where the errors occurred in the fourth memory device, an operation of selecting and repairing the area where the errors occurred in the fourth memory device, and an operation of selecting and disabling the area where the errors occurred in the fourth memory device, according to the state of the fourth memory device. The counter-error operation unit may perform the selected operation.

The controller may select and performs any one of: an operation of designating, as the set time points, time points spaced apart a specific time interval from when power is supplied to the memory system, an operation of counting the number of the errors occurring in the data during the access operations on the plurality of memory devices, designating, as the set time points, each time point at which the counted number exceeds a fifth reference number, and an operation of designating, as the set time points, each time point at which the time required for correcting the errors occurring in the data accessed through the access operations is equal to or longer than a specific time.

In an embodiment, an operating method of a memory system which includes a plurality of memory devices each including an error correction unit and a plurality of cell array regions each having a plurality of memory cells coupled in an array to a plurality of word lines and a plurality of bit lines, the operating method may include: operating the error correction unit to correct errors occurring in data accessed through access operations on the plurality of cell array regions and generating log information on the error correction operation of the error correction unit; setting error ranks to the respective memory devices using the log information; and performing counter-error operations on the respective memory devices according to the error ranks.

The operating may include: operating the error correction unit to correct the errors occurring in the data accessed through the access operations on the plurality of cell array regions; and generating the log information by accumulating and storing error information for the data corrected by the error correction unit in information storage regions in the respective memory devices.

The setting may include: collecting the log information stored in the information storage region at each set time of time; and analyzing the log information collected in the collection step, checking numbers and types of errors occurring in the respective memory devices, and deciding error ranks of the respective memory devices according to the check result.

The analyzing may include: classifying, as a first memory device, a memory device in which the number of errors occurring therein is equal to or more than a first reference number, among the plurality of memory devices; classifying the first memory device as a second memory device having a first error rank, when the type of the errors occurring in the first memory device is a first error occurring in word lines equal to or more than a second reference number; and classifying the first memory device as a third memory device having a second error rank, when the type of the error occurring in the first memory device is a different type of error from the first error.

The performing may include performing any one of: selecting and blocking access to an area where the errors occurred in the second memory device, selecting and repairing the area where the errors occurred in the second memory device, and selecting and disabling the area where the errors occurred in the second memory device, according to the state of the second memory device.

The operation method may further include at least one of: designating, as the set time points, time points spaced apart a specific time interval from when power is supplied to the memory system; counting the number of errors occurring in the data during the access operations on the plurality of memory devices, designating, as the set time points, each time point at which the counted number exceeds a fifth reference number, and resetting the counted number; and designating, as the set time points, each time point at which the time required for correcting the errors occurring in the data accessed through the access operations is equal to or longer than a specific time.

In an embodiment, an operating method of a data processing system, the operating method may include: correcting errors in data read from storage regions within respective memory devices while collecting information on the errors; and performing, based on the information: an operation of repairing a selected storage region regarding the errors within a selected one of the memory devices, or an operation of moving the data from the selected storage region to a normal storage region and blocking access to the selected storage region.

In accordance with the present embodiments, the memory system including the plurality of memory devices may generate log information on errors which occurred during access operations on the respective memory devices, analyze the log information on the errors based on the numbers, types and forms of the errors, and sets different error correcting strengths to the respective memory devices, thereby performing error solution operations on the respective memory devices.

Thus, the memory system may predict a memory device or a specific region of a memory device, in which a serious error is highly likely to occur, among the plurality of memory devices, and perform a suitable counter-error solution operation.

BRIEF DESCRIPTION OF THE DRAWINGS

FIGS. 2 to 4 and 5A and 5B are flowcharts and diagrams illustrating a log information analysis operation in accordance with embodiments.

DETAILED DESCRIPTION

Figure 1A:
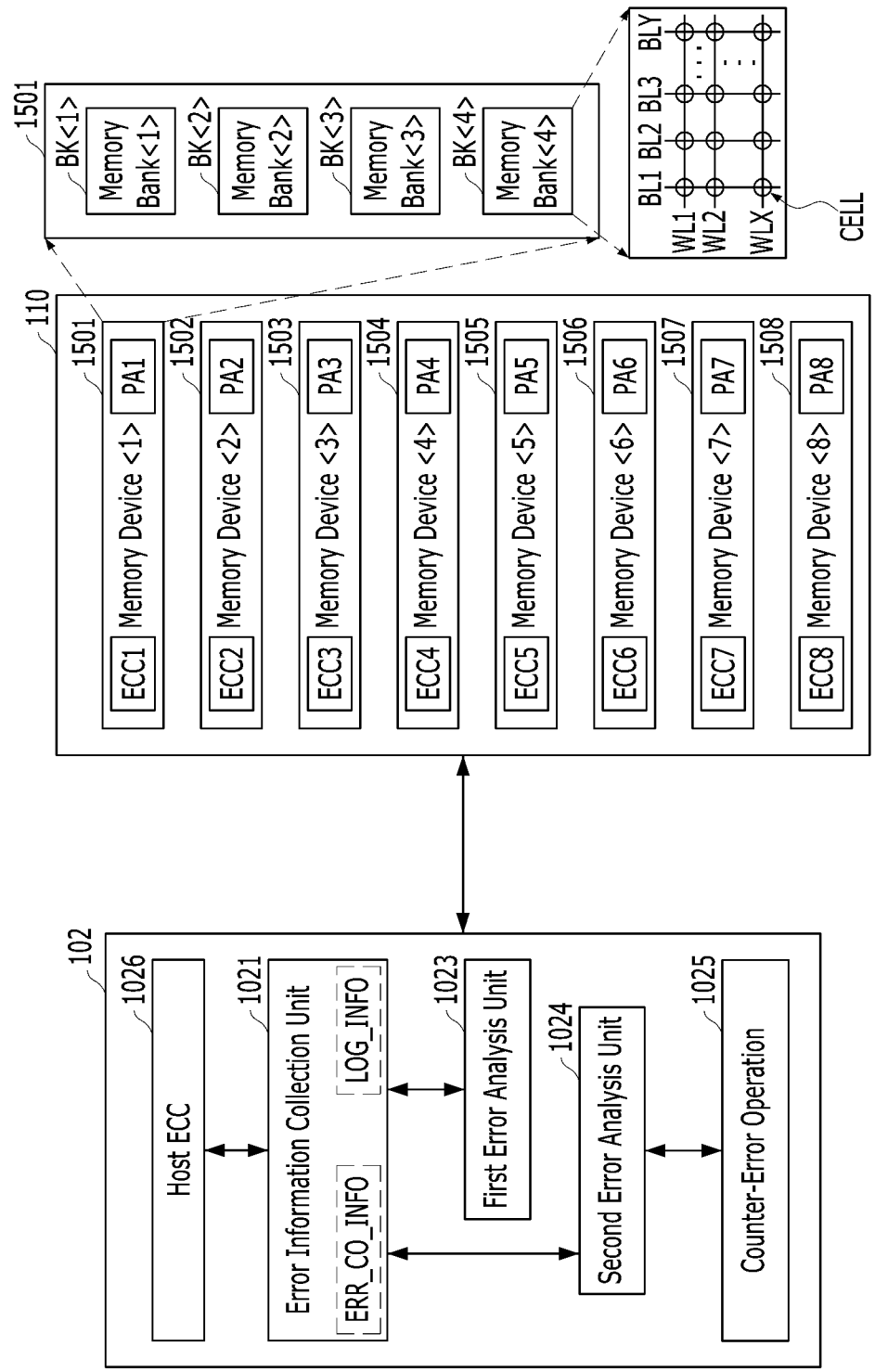
FIG. 1A is a diagram illustrating a configuration of a data processing system in accordance with a first embodiment.

FIG. 1A is a diagram illustrating a configuration of a data processing system in accordance with a first embodiment. Throughout the specification, reference to "a first embodiment, "a second embodiment," "a third embodiment," "an embodiment" or the like does not necessarily mean only that embodiment. Various features of the invention, although described in the context of one embodiment, may be applicable in multiple embodiments.

Referring to FIG. 1A, the data processing system in accordance with the first embodiment may include a host 102 and a memory system 110. The memory system 110 may include a plurality of memory devices 1501 to 1508. The host 102 may include an error information collection unit 1021, a first error analysis unit 1023, a second error analysis unit 1024, a counter-error operation unit 1025 and a host Error Correction Code (ECC) unit 1026.

Each of the memory devices 1501 to 1508 may include a plurality of memory banks BK<1:4>. The memory devices 1501 to 1508 may include memory ECC units ECC1 to ECC8 and information storage areas PA1 to PA8, respectively.

For reference, FIG. 1A is based on the supposition that each of the memory devices 1501 to 1508 is a DRAM. When the memory device is a different type of memory device, the detailed configuration of the memory device may be changed. Specifically, each of the memory banks BK<1:4> may include a plurality of memory cells CELL coupled in an array to a plurality of word lines WL1, WL2 . . . WLX and a plurality of bit lines BL1, BL2, BL3 . . . BLY, and each of the memory cells may store one or more-bit data therein. That is, each of the memory banks BK<1:4> may be considered as 'a cell array region' including a plurality of memory cells in an array. Therefore, the expression 'the plurality of memory banks' is based on the supposition that the memory device is a DRAM. When the memory device is a different type of memory device, the expression 'the plurality of memory banks' may be replaced with the expression 'a plurality of cell array regions'. In short, the design of the internal configurations of the plurality of memory devices 1501 to 1508 may be changed according to the characteristics of the respective memory devices 1501 to 1508, the purpose of use of the memory system 110, or the specification of the memory system 110, requested by the host 102.

When errors, which occur during access operations performed by the plurality of memory devices 1501 to 1508 included in the memory system 110, for example, data read/write operations, are corrected through operations of the memory ECC units ECC1 to ECC8 included in the plurality of memory devices 1501 to 1508, the plurality of memory devices 1501 to 1508 may generate log information LOG_INFO on data whose errors are corrected by the memory ECC units ECC1 to ECC8. That is, the plurality of memory devices 1501 to 1508 may generate the log information LOG_INFO by accumulating and storing error information (e.g. raw data) in the information storage areas PA1 to PA8, the error information being associated with the errors, which are corrected by the memory ECC units ECC1 to ECC8 during the access operations. The error information, associated with the errors and included in the log information LOG_INFO, may indicate all data which can be generated by the plurality of memory devices 1501 to 1508 in relation with the occurrences of the errors. That is, the error information, associated with the errors and included in the log information LOG_INFO, may indicate the when the errors occurred, i.e., times at which the errors occurred, respectively (times of the errors), locations of the errors, attributes of the errors, types and numbers of the errors. For example, the error information may indicate the number of bits in data where the errors have occurred, the physical storage locations of the data where the errors have occurred, the absolute times of the errors, the range of physical areas in which the errors have occurred, and the types of the errors which have occurred. The information storage areas PA1 to PA8 may be configured as storage spaces which are included in the form of registers in the respective memory devices 1501 to 1508. Each of the information storage areas PA1 to PA8 may correspond to at least a part of at least one of the plurality of banks BK<1:4> included in the corresponding memory device.

The host 102 may collect the error information associated with the errors occurring in the plurality of memory devices 1501 to 1508 included in the memory system 110 through the following operations.

According to the first operation, error information associated with errors, which are corrected by the memory ECC units ECC1 to ECC8 during the access operations for the respective memory devices 1501 to 1508, may be accumulated and stored as the log information LOG_INFO in the information storage areas PA1 to PA8. Therefore, the host 102 may collect the log information LOG_INFO from the information storage areas PA1 to PA8 of the respective memory devices 1501 to 1508.

According to the second operation, the host 102 may generate and collect error information as error correction information ERR_CO_INFO, the error information being associated with errors, which are corrected by the host ECC unit 1026 included therein during the access operations for the respective memory devices 1501 to 1508, for example, data read operations. The error related to the error correction information ERR_CO_INFO may be an error not corrected by the memory ECC units ECC1 to ECC8 in the memory devices 1501 to 1508 but by the host ECC unit 1026 in the host 102. The error information, associated with the errors and included in the error correction information ERR_CO_INFO, may indicate all data which can be generated by the host ECC unit 1026 in relation to the occurrences of the errors. That is, the error information, associated with the errors and included in the error correction information ERR_CO_INFO, may indicate the times of the errors, locations of the errors, attributes of the errors, types and numbers of the errors. For example, the error information may indicate the number of bits in data where the errors have occurred, the physical storage locations of the data where the errors have occurred, the absolute times of the errors, the range of physical areas in which the errors have occurred, and the types of the errors which have occurred.

The host 102 may analyze the log information LOG_INFO and the error correction information ERR_CO_INFO, and thus determine the number, types and forms of errors which have occurred in each of the memory devices 1501 to 1508. Therefore, the host 102 may analyze the log information LOG_INFO and the error correction information ERR_CO_INFO based on the number, types and forms of the errors, and set different error correcting strengths to the respective memory devices 1501 to 1508 included in the memory system 110. The host 102 may perform different counter-error operations on the respective memory devices 1501 to 1508 according to the error correcting strengths.

More specifically, the error information collection unit 1021 included in the host 102 may transfer a command (not illustrated) for information collection to the memory system 110 at set time points, and receive and collect the log information LOG_INFO outputted from the information storage areas PA1 to PA8 of the plurality of memory devices 1501 to 1508 included in the memory system 110 in response to the command for information collection. The error information collection unit 1021 may collect the error correction information ERR_CO_INFO generated by the host ECC unit 1026 in real time or at each set time point.

The host 102 may select and designate the set time points according to any of the scenarios below.

First, the host 102 may designate, as the set time points, time points that reoccur at a specific time interval starting from when power is supplied to the memory system 110. Thus, in this scenario the designated time points reoccur at a specific frequency starting from when power is supplied to the memory system 110.

Second, the host 102 may count the number of errors occurring during an access operation on the memory system 110, i.e., an access operation on the plurality of memory devices 1501 to 1508, and designate each time point at which the counted number exceeds a reference number as the set time points. The reference number may be set in advance. The counted number may be reset at each set time point after the error counting performed at that set time point is completed. The number of errors may be counted by the host ECC unit 1026, for example.

Third, the host 102 may perform an error correction operation for correcting an error occurring during an access operation on the memory system 110, i.e. an access operation on the plurality of memory devices 1501 to 1508, and designate, as the set time points, each time point at which the time required for the error correction operation becomes equal to or longer than a specific time. When the time required for the error correction operation is equal to or longer than the specific time, it may indicate that a relatively simple error correction operation using the hamming code failed and thus a relatively complex error correction operation using the Reed-Solomon code was used, during the process of correcting the error. For example, the error correction operation may be performed by the host ECC unit 1026.

The error information collection unit 1021 may store the log information LOG_INFO and the error correction information ERR_CO_INFO in a set space within the host 102. As illustrated in FIG. 1A, the set space may be a separate storage area within the error information collection unit 1021. Although not directly illustrated in FIG. 1A, the set space within the host 102 may be a specific storage space of a host memory which is included in the host 102 and used as a working memory of the host 102. The first error analysis unit 1023 may analyze the log information LOG_INFO and the error correction information ERR_CO_INFO collected by the error information collection unit 1021, check the numbers and types of errors which occurred in the respective memory devices 1501 to 1508, and decide error ranks of the respective memory devices 1501 to 1508 according to the numbers and types determined in the check operation. Information on the error ranks of the respective memory devices 1501 to 1508, decided by the first error analysis unit 1023, may be stored in the set space within the host 102.

The second error analysis unit 1024 may select some of the plurality of memory devices 1501 to 1508 according to the error ranks of the respective memory devices 1501 to 1508, decided by the first error analysis unit 1023. For the some memory devices selected among the plurality of memory devices 1501 to 1508, the second error analysis unit 1024 may decide error correcting strengths by checking the forms and numbers of errors through additional analysis of the log information LOG_INFO and the error correction information ERR_CO_INFO. For the other memory devices except the selected memory devices, the second error analysis unit 1024 may decide error correcting strengths corresponding to the error ranks decided by the first error analysis unit 1023. The second error analysis unit 1024 may read the error correcting strengths for the respective memory devices 1501 to 1508, decided by the first error analysis unit 1023, from the set space within the host 102. Furthermore, the information on the error ranks of the respective memory devices 1501 to 1508, decided by the second error analysis unit 1024, may be stored in the set space within the host 102.

The counter-error operation unit 1025 may perform different counter-error operations on the respective memory devices 1501 to 1508 according to the error correcting strengths for the memory devices 1501 to 1508, decided by the second error analysis unit 1024. The counter-error operation unit 1025 may read the error correcting strengths for the respective memory devices 1501 to 1508, decided by the second error analysis unit 1024, from the set space within the host 102.

The host ECC unit 1026 may generate an ECC by performing an error correction encoding operation on data which are generated so as to be stored in the memory system 110. The host 102 may transfer codeword-based data to the memory system 110, the codeword-based data being configured by including the ECC in the data to be stored in the memory system 110. The memory system 110 may store the codeword-based data, inputted from the host 102, in the plurality of memory devices 1501 to 1508. The host ECC unit 1026 may perform an operation of checking whether an error occurred in the data inputted from the memory system 110, and perform an error correction decoding operation, i.e. the error correction operation, when an error occurred in the input data, thereby recovering normal data before the occurrence of the error. Since the data transferred to the memory system 110 from the host 102 are codeword-based data, the data inputted from the memory system 110 to the host 102 may also be codeword-based data. Therefore, the host ECC unit 1206 may perform the error correction operation by using the ECC included in the codeword-based data inputted to the host 102. When the number of error bits occurring in the data is equal to or more than a correctable error bit limit, the host ECC unit 1026 may fail in the error correction operation, and cannot correct the error bits. The host ECC unit 1026 may perform error correction using coded modulation such as a hamming code, LDPC (low density parity check) code, BCH (Bose, Chaudhri, Hocquenghem) code, turbo code, Reed-Solomon code, convolution code, RSC (recursive systematic code), TCM (trellis-coded modulation) or BCM (Block coded modulation), and the present embodiment is not limited thereto. The host ECC unit 1026 may include a code, circuit, module, system or device for error correction.

For reference, the size of data which can be error-corrected by the host ECC unit 1026 included in the host 102 may be different from the size of data which can be error-corrected by each of the memory ECC units ECC1 to ECC8 included in the respective memory devices 1501 to 1508. For example, the size of data which can be error-corrected by the host ECC unit 1026 may be larger than the size of data which can be error-corrected by each of the memory ECC units ECC1 to ECC8. In the present embodiment, it has been described that all of the host ECC unit 1026 and the memory ECC units ECC1 to ECC8 can perform error correction operations. However, this is only an example, but the present embodiment is not limited thereto. In an embodiment, the memory ECC units ECC1 to ECC8 may perform only the error checking operation of checking whether an error occurred, and the host ECC unit 1026 may perform both of the error checking operation and the error correction operation.

Figure 1B:
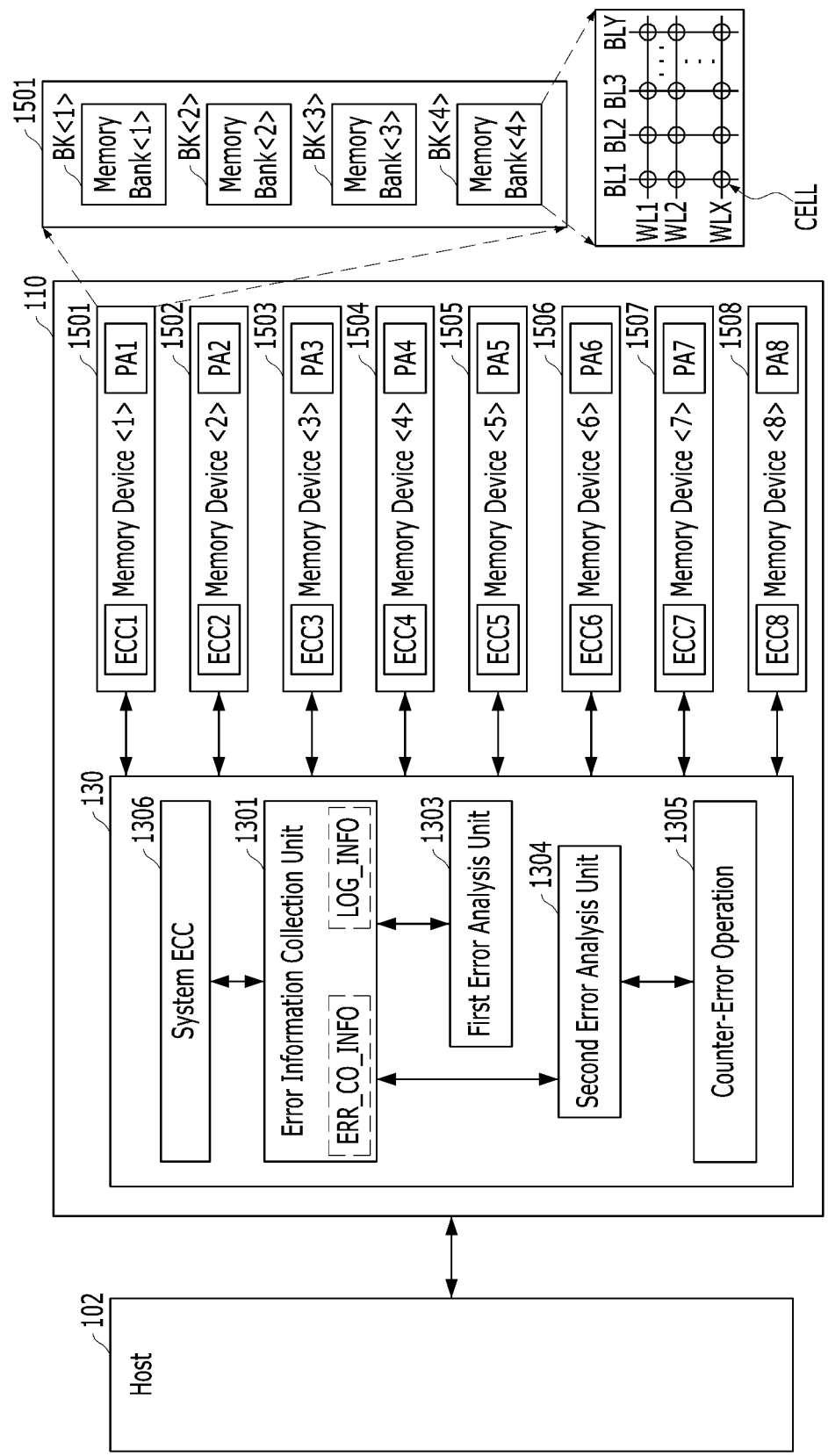
FIG. 1B is a diagram illustrating a configuration of a data processing system in accordance with a second embodiment.

FIG. 1B is a diagram illustrating a configuration of a data processing system in accordance with a second embodiment.

Referring to FIG. 1B, the data processing system in accordance with the second embodiment may include a host 102 and a memory system 110. The memory system 110 may include a controller 130 and a plurality of memory devices 1501 to 1508. The controller 130 may include an error information collection unit 1301, a first error analysis unit 1303, a second error analysis unit 1304, a counter-error operation unit 1305 and a system ECC unit 1306.

Each of the memory devices 1501 to 1508 may include a plurality of memory banks BK<1:4>. Furthermore, the memory devices 1501 to 1508 may include memory ECC units ECC1 to ECC8 and information storage areas PA1 to PA8, respectively.

For reference, FIG. 1B is based on the supposition that each of the memory devices 1501 to 1508 is a DRAM. When the memory device is a different type of memory device, the detailed configuration of the memory device may be changed. Specifically, each of the memory banks BK<1:4> may include a plurality of memory cells CELL coupled in an array to a plurality of word lines WL1, WL2 . . . WLX and a plurality of bit lines BL1, BL2, BL3 . . . BLY, and each of the memory cells may store one or more-bit data therein. That is, each of the memory banks BK<1:4> may be considered as 'a cell array region' including a plurality of memory cells in an array. Therefore, the expression 'the plurality of memory banks' is based on the supposition that the memory device is a DRAM. When the memory device is a different type of memory device, the expression 'the plurality of memory banks' may be replaced with the expression 'a plurality of cell array regions'. In short, the design of the internal configurations of the plurality of memory devices 1501 to 1508 may be changed according to the characteristics of the respective memory devices 1501 to 1508, the purpose of use of the memory system 110, or the specification of the memory system 110, requested by the host 102.

When errors, which occur during access operations performed by the plurality of memory devices 1501 to 1508 included in the memory system 110, for example, data read/write operations, are corrected through operations of the memory ECC units ECC1 to ECC8 included in the plurality of memory devices 1501 to 1508, the plurality of memory devices 1501 to 1508 may generate log information LOG_INFO on data whose errors are corrected by the memory ECC units ECC1 to ECC8. That is, the plurality of memory devices 1501 to 1508 may generate the log information LOG_INFO by accumulating and storing error information in the information storage areas PA1 to PA8, the error information being associated with the errors, which are corrected by the memory ECC units ECC1 to ECC8 during the access operations. The error information, associated with the errors and included in the log information LOG_INFO, may indicate all data which can be generated by the plurality of memory devices 1501 to 1508 in relation with the occurrences of the errors. That is, the error information, associated with the errors and included in the log information LOG_INFO, may indicate the times of the errors, locations of the errors, attributes of the errors, types and numbers of the errors. For example, the error information may indicate the number of bits in data where the errors have occurred, the physical storage locations of the data where the errors have occurred, the absolute times of the errors, the range of physical areas in which the errors have occurred, and the types of the errors which have occurred. The information storage areas PA1 to PA8 may be configured as storage spaces which are included in the form of registers in the respective memory devices 1501 to 1508. Each of the information storage areas PA1 to PA8 may correspond to at least a part of at least one of the plurality of banks BK<1:4> included in the corresponding memory device.

The controller 130 may collect error information associated with errors occurring in the plurality of memory devices 1501 to 1508 included in the memory system 110 through the following operations.

According to the first operation, error information associated with errors, which are corrected by the memory ECC units ECC1 to ECC8 during the access operations for the respective memory devices 1501 to 1508, may be accumulated and stored as the log information LOG_INFO in the information storage areas PA1 to PA8. Therefore, the controller 130 may collect the log information LOG_INFO from the information storage areas PA1 to PA8 of the respective memory devices 1501 to 1508.

According to the second operation, the controller 130 may generate and collect error information as error correction information ERR_CO_INFO, the error information being associated with errors, which are corrected by the system ECC unit 1306 included therein during the access operations for the respective memory devices 1501 to 1508, for example, data read operations. The access operation in which an error is corrected by the system ECC unit 1306 included in the controller 130 may be assumed to be an access operation in which an error is not corrected by the corresponding memory ECC unit among the memory ECC units ECC1 to ECC8 included in the respective memory devices 1501 to 1508. The error information, associated with the errors and included in the error correction information ERR_CO_INFO, may indicate all data which can be generated by the system ECC unit 1306 in relation to the occurrences of the errors. That is, the error information, associated with the errors and included in the error correction information ERR_CO_INFO, may indicate the times of the errors, locations of the errors, attributes of the errors, types and numbers of the errors. For example, the error information may indicate the number of bits in data where the errors have occurred, the physical storage locations of the data where the errors have occurred, the absolute times of the errors, the range of physical areas in which the errors have occurred, and the types of the errors which have occurred.

The controller 130 may analyze the log information LOG_INFO and the error correction information ERR_CO_INFO, and thus determine the number, types and forms of errors which have occurred in each of the memory devices 1501 to 1508. Therefore, the controller 130 may analyze the log information LOG_INFO and the error correction information ERR_CO_INFO based on the number, types and forms of the errors, and set different error correcting strengths to the respective memory devices 1501 to 1508 included in the memory system 110. The controller 130 may perform different counter-error operations on the respective memory devices 1501 to 1508 according to the error correcting strengths.

More specifically, the error information collection unit 1301 included in the controller 130 may transfer a command (not illustrated) for information collection to the memory system 110 at set time points, and then receive and collect the log information LOG_INFO outputted from the information storage areas PA1 to PA8 of the plurality of memory devices 1501 to 1508 included in the memory system 110 in response to the command for information collection. The error information collection unit 1301 may collect the error correction information ERR_CO_INFO generated by the system ECC unit 1306 in real time or at each set time point.

The controller 130 may select and designate set time points according to any of the following scenarios.

First, the controller 130 may designate, as the set time points, time points that reoccur at a specific time interval starting from when power is supplied to the memory system 110.

Second, the controller 130 may count the number of errors occurring during an access operation on the memory system 110, i.e. an access operation on the plurality of memory devices 1501 to 1508, and designate, as the preset time points, each time point at which the counted number exceeds a reference number. The counted number may be reset at each set time point after the associated error counting is completed. The number of errors may be counted by the system ECC unit 1306.

Third, the controller 130 may perform an error correction operation for correcting an error occurring during an access operation on the memory system 110, i.e. an access operation on the plurality of memory devices 1501 to 1508, and designate, as the set time points, each time point at which the time required for the error correction operation becomes equal to or longer than a specific time. When the time required for the error correction operation is equal to or longer than the specific time, it may indicate that a relatively simple error correction operation using the hamming code failed and thus a relatively complex error correction operation using the Reed-Solomon code was used, during the process of correcting the error. For example, the error correction operation may be performed by the system ECC unit 1306.

The error information collection unit 1301 may store the log information LOG_INFO and the error correction information ERR_CO_INFO in a set space within the controller 130. As illustrated in FIG. 1B, the set space may be a separate storage area within the error information collection unit 1301. Although not directly illustrated in FIG. 1B, the set space within the controller 130 may be a specific storage space of a system memory which is included in the controller 130 and used as a working memory of the memory system 110.

The first error analysis unit 1303 may analyze the log information LOG_INFO and the error correction information ERR_CO_INFO collected by the error information collection unit 1301, check the numbers and types of errors which occurred in the respective memory devices 1501 to 1508, and decide error ranks for the respective memory devices 1501 to 1508 according to the numbers and types determined by the check operation. The information on the error ranks of the respective memory devices 1501 to 1508, decided by the first error analysis unit 1303, may be stored in the set space within the controller 130.

The second error analysis unit 1304 may select some of the plurality of memory devices 1501 to 1508 according to the error ranks of the respective memory devices 1501 to 1508, decided by the first error analysis unit 1303. For the some memory devices selected among the plurality of memory devices 1501 to 1508, the second error analysis unit 1304 may decide error correcting strengths by checking the forms and numbers of the errors through additional analysis of the log information LOG_INFO and the error correction information ERR_CO_INFO. For the other memory devices except the selected memory devices, the second error analysis unit 1304 may decide error correcting strengths corresponding to the error ranks decided by the first error analysis unit 1303. The second error analysis unit 1304 may read the error correcting strengths for the respective memory devices 1501 to 1508, decided by the first error analysis unit 1303, from the set space within the controller 130. Furthermore, the information on the error ranks of the respective memory devices 1501 to 1508, decided by the second error analysis unit 1304, may be stored in the set space within the controller 130.

The counter-error operation unit 1305 may perform different counter-error operations on the respective memory devices 1501 to 1508 according to the error correcting strengths for the memory devices 1501 to 1508, decided by the second error analysis unit 1304. The counter-error operation unit 1305 may read the error correcting strengths for the respective memory devices 1501 to 1508, decided by the second error analysis unit 1304, from the set space within the controller 130.

The system ECC unit 1306 may generate an ECC by performing an error correction encoding operation on data to be stored in the respective memory devices 1501 to 1508. The controller 130 may transfer codeword-based data to the respective memory devices 1501 to 1508, the codeword-based data being configured by including the ECC in the data to be stored in the respective memory devices 1501 to 1508. The codeword-based data inputted from the controller 130 may be stored in the plurality of memory devices 1501 to 1508. The system ECC unit 1306 may perform an operation of checking whether an error occurred in the data read from the respective memory devices 1501 to 1508, and perform an error correction decoding operation, i.e. the error correction operation, when an error occurred in the read data, thereby recovering normal data before the occurrence of the error. Since the data stored in the plurality of memory devices 1501 to 1508 are codeword-based data, the data read from the respective memory devices 1501 to 1508 may also be codeword-based data. Therefore, the system ECC unit 1306 may perform the error correction operation by using the ECC included in the codeword-based data read from the respective memory devices 1501 to 1508. When the number of error bits occurring in the data is equal to or more than a correctable error bit limit, the system ECC unit 1306 may fail in the error correction operation, and cannot correct the error bits. The system ECC unit 1306 may perform error correction using coded modulation such as a hamming code, LDPC (low density parity check) code, BCH (Bose, Chaudhri, Hocquenghem) code, turbo code, Reed-Solomon code, convolution code, RSC (recursive systematic code), TCM (trellis-coded modulation) or BCM (Block coded modulation), and the present embodiment is not limited thereto. The system ECC unit 1306 may include a code, circuit, module, system or device for error correction.

For reference, the size of data which can be error-corrected by the system ECC unit 1306 included in the controller 130 may be different from the size of data which can be error-corrected by each of the memory ECC units ECC1 to ECC8 included in the respective memory devices 1501 to 1508. For example, the size of data which can be error-corrected by the system ECC unit 1306 may be larger than the size of data which can be error-corrected by each of the memory ECC units ECC1 to ECC8. In the present embodiment, it has been described that all of the system ECC unit 1306 and the memory ECC units ECC1 to ECC8 can perform error correction operations. However, this is only an example, but the present embodiment is not limited thereto. In an embodiment, the memory ECC units ECC1 to ECC8 may perform only the error checking operation of checking whether an error occurred, and the system ECC unit 1306 may perform both of the error checking operation and the error correction operation.

Figure 1C:
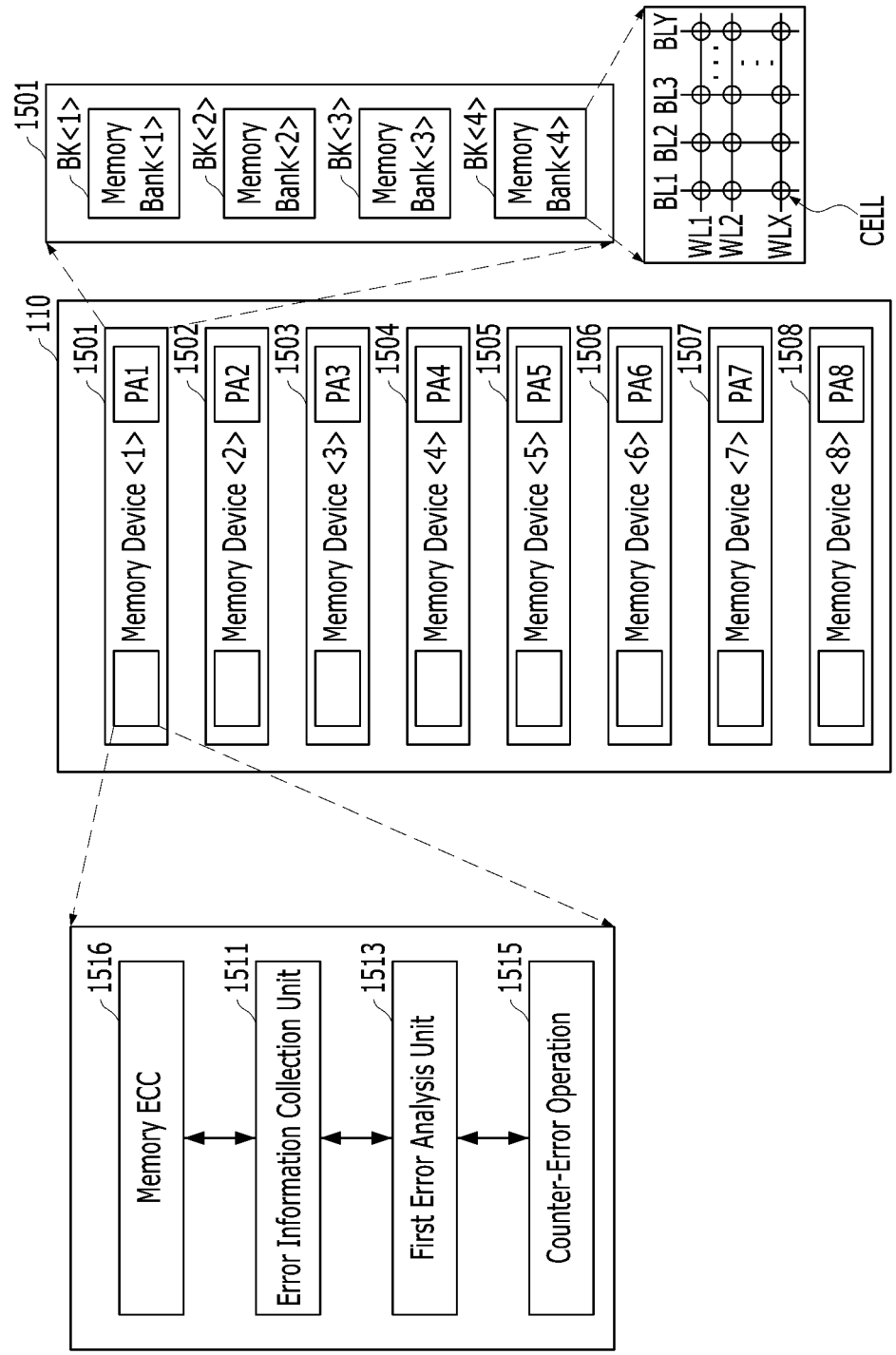
FIG. 1C is a diagram illustrating a configuration of a memory system in accordance with a third embodiment.

FIG. 1C is a diagram illustrating a configuration of a memory system in accordance with a third embodiment.

Referring to FIG. 1, the memory system 110 in accordance with the third embodiment may include a plurality of memory devices 1501 to 1508. Each of the memory devices 1501 to 1508 may include a plurality of memory banks BK<1:4>, an error information collection unit 1511, an error analysis unit 1513, a counter-error operation unit 1515 and a memory ECC unit 1516. Furthermore, the memory devices 1501 to 1508 may include information storage areas PA1 to PA8, respectively.

For reference, FIG. 1C is based on the supposition that each of the memory devices 1501 to 1508 is a DRAM. When the memory device is a different type of memory device, the detailed configuration of the memory device may be changed. Specifically, each of the memory banks BK<1:4> may include a plurality of memory cells CELL coupled in an array to a plurality of word lines WL1, WL2 . . . WLX and a plurality of bit lines BL1, BL2, BL3 . . . BLY, and each of the memory cells may store one or more-bit data therein. That is, each of the memory banks BK<1:4> may be considered as 'a cell array region' including a plurality of memory cells in an array. Therefore, the expression 'the plurality of memory banks' is based on the supposition that the memory device is a DRAM. When the memory device is a different type of memory device, the expression 'the plurality of memory banks' may be replaced with the expression 'a plurality of cell array regions'. In short, the design of the internal configurations of the plurality of memory devices 1501 to 1508 may be changed according to the characteristics of the respective memory devices 1501 to 1508, the purpose of use of the memory system 110, or the specification of the memory system 110.

When errors, which occur during access operations performed by the plurality of memory devices 1501 to 1508 included in the memory system 110, for example, data read/write operations, are corrected through operations of the memory ECC units ECC1 to ECC8 included in the plurality of memory devices 1501 to 1508, the plurality of memory devices 1501 to 1508 may generate log information LOG_INFO on data whose errors are corrected by the memory ECC units ECC1 to ECC8. That is, the plurality of memory devices 1501 to 1508 may generate the log information LOG_INFO by accumulating and storing error information in the information storage areas PA1 to PA8, the error information being associated with the errors, which are corrected by the memory ECC units ECC1 to ECC8 during the access operations. The error information, associated with the errors and included in the log information LOG_INFO, may indicate all data which can be generated by the plurality of memory devices 1501 to 1508 in relation with the occurrences of the errors. That is, the error information, associated with the errors and included in the log information LOG_INFO, may indicate the times of the errors, locations of the errors, attributes of the errors, types and numbers of the errors. For example, the error information may indicate the number of bits in data where the errors have occurred, the physical storage locations of the data where the errors have occurred, the absolute times of the errors, the range of physical areas in which the errors have occurred, and the types of the errors which have occurred. The information storage areas PA1 to PA8 may be configured as storage spaces which are included in the form of registers in the respective memory devices 1501 to 1508. Each of the information storage areas PA1 to PA8 may correspond to at least a part of at least one of the plurality of banks BK<1:4> included in the corresponding memory device.

Specifically, the error information collection unit 1511 may collect the log information LOG_INFO, which is generated by the memory ECC unit 1516 and stored in the information storage areas PA1 to PA8, in real time or at each set time point.

The error information collection unit 1511 may select and designate set time points according to any of the following scenarios.

First, the error information collection unit 1511 may designate, as the set time points, time points that reoccur at a specific time interval starting from when power is supplied to the memory system 110.

Second, the error information collection unit 1511 may count the number of errors occurring during an access operation on the plurality of memory devices 1501 to 1508, and designate, as the set time points, each time point at which the counted number exceeds a reference number. The counted number may be reset at set time point after the associated error counting is completed. The number of errors may be counted by the memory ECC unit 1516.

Third, the error information collection unit 1511 may perform an error correction operation for correcting an error occurring during an access operation on the plurality of memory devices 1501 to 1508, and designate, as the set time points, each time point when the time required for the error correction operation becomes equal to or longer than a specific time. When the time required for the error correction operation is equal to or longer than the specific time, it may indicate that a relatively simple error correction operation using the hamming code failed and thus a relatively complex error correction operation using the Reed-Solomon code was used, during the process of correcting the error. For example, the error correction operation may be performed by the memory ECC unit 1516.

The error analysis unit 1513 may analyze the log information LOG_INFO collected by the error information collection unit 1511 and the error correction information ERR_CO_INFO, and thus determine the number, types and forms of errors which occurred in each of the memory devices 1501 to 1508. Specifically, the error analysis unit 1513 may analyze the log information LOG_INFO collected by the error information collection unit 1511, check the number and types of errors which occurred in each of the memory devices 1501 to 1508, and decide error ranks of the respective memory devices 1501 to 1508 according to the number and types of the errors determined by the check operation. The information on the error ranks of the respective memory devices 1501 to 1508, decided by the error analysis unit 1513, may be stored in the information storage areas PA1 to PA8.

The counter-error operation unit 1515 may perform different counter-error operations on the respective memory devices 1501 to 1508 according to the error ranks of the memory devices 1501 to 1508, decided by the error analysis unit 1513. The counter-error operation unit 1515 may read the error ranks of the respective memory devices 1501 to 1508, decided by the error analysis unit 1513, from the information storage areas PA1 to PA8.

The memory ECC unit 1516 may generate an ECC by performing an error correction encoding operation on data to be stored in the respective memory devices 1501 to 1508. The memory ECC unit 1516 may store codeword-based data in the plurality of memory devices 1501 to 1508, the codeword-based data being configured by including the ECC in the data to be stored in the respective memory devices 1501 to 1508. The memory ECC unit 1516 may perform an operation of checking whether an error occurred in the data read from the respective memory devices 1501 to 1508, and perform an error correction decoding operation, i.e. the error correction operation, when an error occurred in the read data, thereby recovering normal data before the occurrence of the error. Since the data stored in the respective memory devices 1501 to 1508 are codeword-based data, the data read from the respective memory devices 1501 to 1508 may also be codeword-based data. Therefore, the memory ECC unit 1516 may perform the error correction operation by using the ECC included in the codeword-based data read from the respective memory devices 1501 to 1508. When the number of error bits occurring in the data is equal to or more than a correctable error bit limit, the memory ECC unit 1516 may fail in the error correction operation, and cannot correct the error bits. The memory ECC unit 1516 may perform error correction using coded modulation such as a parity code, hamming code, LDPC (low density parity check) code, BCH (Bose, Chaudhri, Hocquenghem) code, turbo code, Reed-Solomon code, convolution code, RSC (recursive systematic code), TCM (trellis-coded modulation) or BCM (Block coded modulation), and the present embodiment is not limited thereto. The memory ECC unit 1516 may include a code, circuit, module, system or device for error correction.

FIGS. 2 to 4 and 5A and 5B are flowcharts and diagrams for describing a log information analysis operation of the data processing system in accordance with embodiments.

Figure 2:
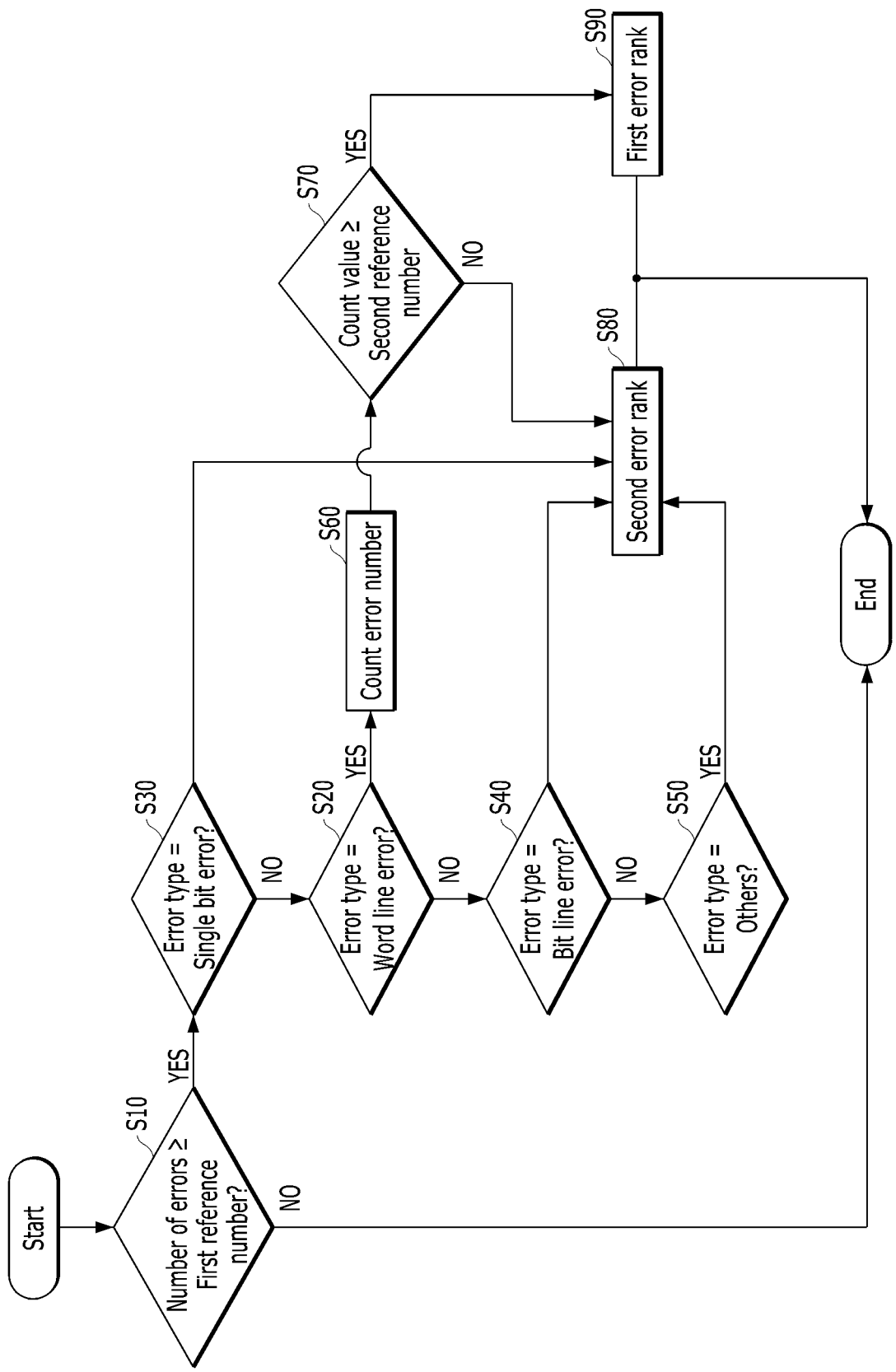

FIGS. 1A and 2 show the method in which the data processing system analyzes the log information LOG_INFO and the error correction information ERR_CO_INFO, and decides the error ranks of the respective memory devices 1501 to 1508.

Specifically, when errors occurring during access operations performed by the plurality of memory devices 1501 to 1508, for example, data read/write operations, are corrected through operations of the memory ECC units ECC1 to ECC8 included in the plurality of memory devices 1501 to 1508, the plurality of memory devices 1501 to 1508 may generate the log information LOG_INFO on the data whose errors are corrected by the memory ECC units ECC1 to ECC8.

When the errors are corrected by the host ECC unit 1026 included in the host 102 during the access operations for the respective memory devices 1501 to 1508, for example, data read operations, the host 102 may generate the error correction information ERR_CO_INFO on the data whose errors are corrected by the host ECC unit 1026.

The host 102 may collect and analyze the log information LOG_INFO and the error correction information ERR_CO_INFO. That is, the host 102 may decide error ranks and error correcting strengths for the respective memory devices 1501 to 1508.

For reference, although not concretely illustrated in the drawings, the memory system 110 may further include a host interface (not illustrated) for transferring signals between the host 102 and the plurality of memory devices 1501 to 1508. That is, each of the memory devices 1501 to 1508 may output the log information LOG_INFO generated therein to the host 102 through the host interface.

Also, although not concretely illustrated in the drawings, the host 102 may further include a memory interface (not illustrated) for transferring signals between the memory system 110 and the other components 1021 to 1026 within the host 102. That is, the host 102 may receive the log information LOG_INFO, outputted by the plurality of memory devices 1501 to 1508 through the memory system 110, through the memory interface.

The first error analysis unit 1023 included in the host 102 may analyze the log information LOG_INFO and the error correction information ERR_CO_INFO collected by the error information collection unit 1021, check a memory device in which the number of errors occurring therein is equal to or more than a first reference number, among the plurality of memory devices 1501 to 1508, and classify the corresponding memory device as 'a first memory device' in step S10.

For example, suppose that the number of errors corrected by the host ECC unit 1026 or the memory ECC units ECC1 to ECC8 during an access process for the memory device 1501 among the plurality of memory devices 1501 to 1508 is 12, and the number of errors corrected by the host ECC unit 1026 or the memory ECC units ECC1 to ECC8 during access processes for the other memory devices 1502 to 1508 is less than 10. Furthermore, suppose that the first reference number is 10. In this case, the first error analysis unit 1023 may classify the memory device 1501 as 'the first memory device', and not decide error ranks of the other memory devices 1502 to 1508.

Specifically, the first error analysis unit 1023 may analyze the log information LOG_INFO and the error correction information ERR_CO_INFO, and check the types of the errors which occurred in the memory device classified as 'the first memory device' (YES in step S10). The first error analysis unit 1023 may sort the errors, which occurred in the memory device classified as 'the first memory device', into an error occurring in word line units in step S20, an error occurring in single bit units in step S30, an error occurring in bit line units in step S40, and the other errors in step S50.

The error occurring in word line units in step S20 may indicate that two or more errors occurring in the memory device classified as 'the first memory device' occur in the same word line within the same bank. The error occurring in single bit units in step S30 may indicate that one or no error occurs in the same word line and the same bit line. The error occurring in bit line units in step S40 may indicate that two or more errors occurring in the memory device classified as 'the first memory device' occur in the same bit line. The other errors in step S50 may indicate that two or more errors occurring in the memory device classified as 'the first memory device' have no specific distribution. For example, the other errors in step S50 may indicate errors other than errors that occurred in word line units, single bit units or bit line units.

When the result obtained by checking the types of the errors which occurred in the memory device classified as 'the first memory device' indicates that the errors are errors occurring in word line units in step S20, the first error analysis unit 1023 may count the number of errors which occurred in the same word line in the memory device classified as 'the first memory device', in step S60. When the number of errors counted is equal to or more than a second reference number (YES in step S70), the first error analysis unit 1023 may classify the corresponding memory device as 'a second memory device' by deciding the error rank of the memory device as a first error rank, in step S90. When the number of errors counted is less than the second reference number (NO in step S70), the first error analysis unit 1023 may classify the corresponding memory device as 'a third memory device' by deciding the error rank of the memory device as a second error rank, in step S80.

When the result obtained by checking the types of the errors which occurred in the memory device classified as 'the first memory device' indicates that the errors are errors occurring in single bit units in step S30, errors occurring in bit line units in step S40, and the other errors in step S50, the first error analysis unit 1023 may classify the corresponding memory device as 'the third memory device' by deciding the error rank of the memory device as the second error rank, in step S80.

For example, suppose that the errors which occurred in the memory device 1501 classified as 'the first memory device' are errors occurring in word line units, and the number of errors which occurred in the same word line is equal to or more than the second reference number. In this case, the first error analysis unit 1023 may classify the memory device 1501, classified as 'the first memory device', as 'the second memory device' by deciding the error rank of the memory device 1501 as the first error rank.

Figure 3:
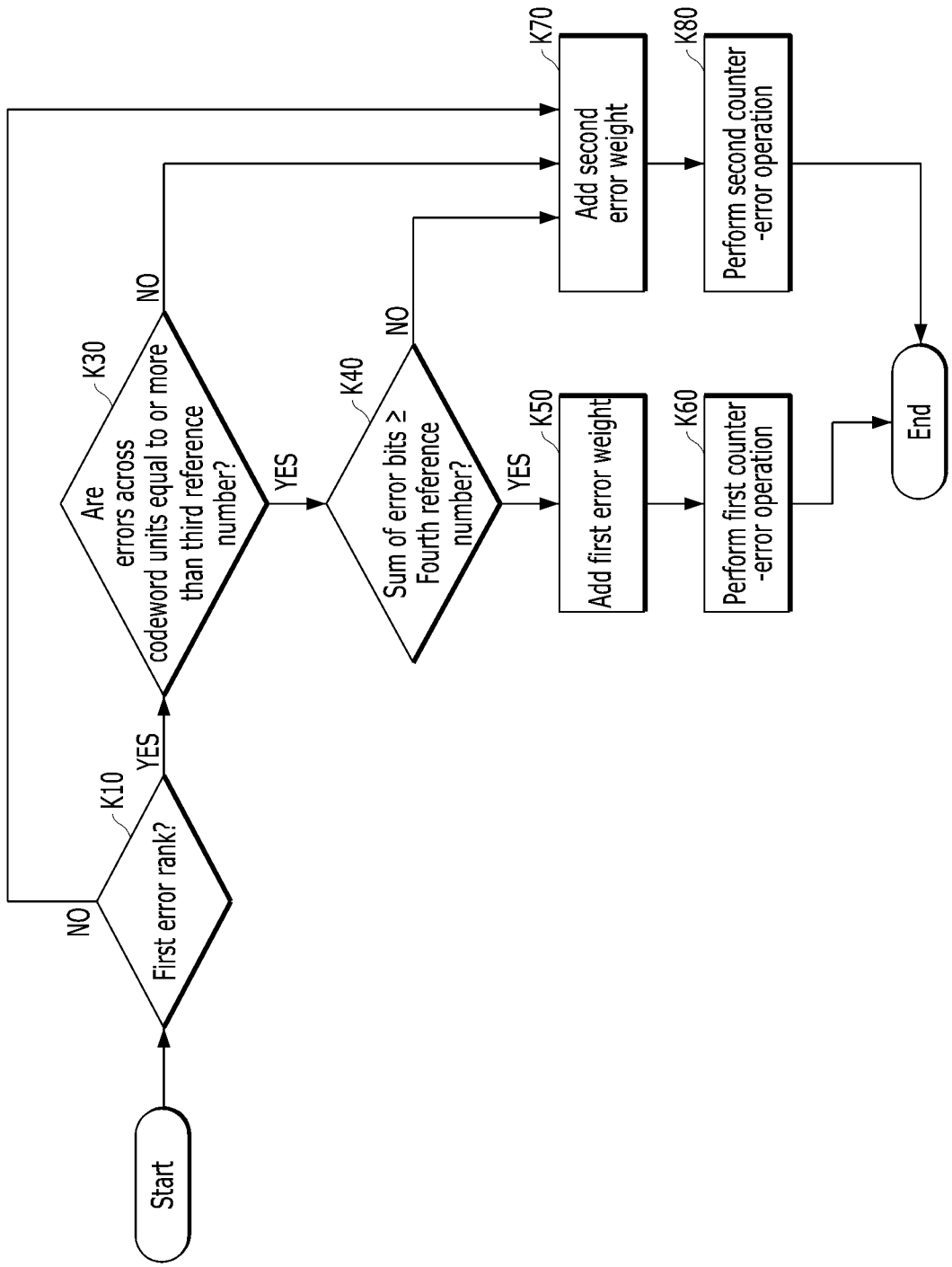

Referring to FIGS. 1A, 2 and 3, the second error analysis unit 1024 included in the host 102 may select some of the plurality of memory devices 1501 to 1508 according to the error ranks for the respective memory devices 1501 to 1508, decided by the first error analysis unit 1023. For the memory devices selected among the plurality of memory devices 1501 to 1508, the second error analysis unit 1024 may decide error correcting strengths by checking the forms and numbers of errors through additional analysis of the log information LOG_INFO and the error correction information ERR_CO_INFO. For the other memory devices except the selected memory devices, the second error analysis unit 1024 may decide error correcting strengths corresponding to the error ranks decided by the first error analysis unit 1023.

Specifically, the first error analysis unit 1023 has classified the plurality of memory devices 1501 to 1508 into a memory device whose error rank is not decided, 'the second memory device' whose error rank is decided as the first error rank, and 'the third memory device' whose error rank is decided as the second error rank.

The second error analysis unit 1024 may check whether the error rank decided by the first error analysis unit 1023 is the first error rank, in operation K10.

When the check result of operation K10 indicates that the error rank decided by the first error analysis unit 1023 is not the first error rank (NO in operation K10) or the corresponding memory device is a memory device whose error rank is not decided or 'the third memory device' whose error rank is decided as the second error rank, the second error analysis unit 1024 may classify the memory device as 'a fifth memory device' by assigning a second error correcting strength to the memory device, in operation K70. The counter-error operation unit 1025 may perform a second counter-error operation on the memory device to which the second error correcting strength is assigned and which is classified as 'the fifth memory device', in operation K80.

When the check result of operation K10 indicates that the error rank decided by the first error analysis unit 1023 is the first error rank (YES in operation K10) or the corresponding memory device is 'the second memory device' whose error rank is decided as the first error rank, the second error analysis unit 1024 may check the form and number of errors by additionally analyzing the log information LOG_INFO and the error correction information ERR_CO_INFO, and then decide an error correcting strength. Specifically, the second error analysis unit 1024 may additionally analyze the log information LOG_INFO and the error correction information ERR_CO_INFO on 'the second memory device' whose error rank is decided as the first error rank, and check whether the errors which occurred in 'the second memory device' are across codeword units, a number of which is equal to or more than a third reference number, in operation K30.

The operation of checking errors across codeword units will be described with reference to FIGS. 4, 5A and 5B.

Referring to FIG. 4, the basic meaning of the codeword unit may indicate the amount of data which is set to a reference amount for an operation of correcting an error, when the host ECC unit 1026 included in the host 102 performs the operation of correcting an error. For example, when the host 102 generates 512-bit data to store in the memory system 110 (401), the host ECC unit 1026 may generate a 64-bit ECC (403) by performing an error correction encoding operation (402) on the 512-bit data. The host 102 may divide a total of 572-bit data, obtained by summing up the 512-bit data generated therein and the 64-bit ECC, into two codeword units, and manage the codeword units (404). That is, one codeword unit may include 288-bit data obtained by summing up the 256-bit data generated in the host 102 and the 32-bit ECC. The host 102 may output the 572-bit data to the memory system 110 (405). For reference, FIG. 4 illustrates that the 572-bit data are managed as two codeword units. In reality, however, the 572-bit data may be managed as a smaller or larger number of codeword units.

FIG. 4 is based on the supposition that the memory system 110 includes a total of 18 memory devices, unlike the embodiment of FIG. 1. The memory system 110 may distribute and store the 572-bit data inputted from the host 102 into the 18 memory devices (405). Therefore, 32-bit data may be stored in each of the 18 memory devices. Furthermore, since the host 102 divides the 572-bit data into two codeword units and manages the codeword units, the memory system 110 may store data corresponding to two codeword units in each of the 18 memory devices. Therefore, 16-bit data corresponding to the first codeword unit Codeword0 and 16-bit data corresponding to the second codeword unit Codeword1 may be stored in each of the 18 memory devices. That is, the memory system 110 may distribute and store the 288-bit data corresponding to a first codeword unit Codeword0 and the 288-bit data corresponding to a second codeword unit Codeword1 into the 18 memory devices.

When storing the 572-bit data inputted from the host 102 in each of the 18 memory devices, the memory system 110 may recognize that the 572-bit data are continuous data, and set a burst length BL to store the data. Suppose that each of the 18 memory devices has four data I/O (Input/Output) terminals (×4). In this case, the memory system 110 may set an upper burst length to 4 (BL4) and distribute and store 288-bit data corresponding to the first codeword unit Codeword0 in the 18 memory devices by 16 bits. Furthermore, the memory system 110 may set a lower burst length to 4 (BL4) and distribute and store 288-bit data corresponding to the second codeword unit Codeword1 in the 18 memory devices by 16 bits.

As described with reference to FIG. 4, the host 102 may output data managed as one or more codeword units to the memory system 110. The memory system 110 may distribute and store the data, inputted from the host 102, in a form corresponding to the codeword unit into the plurality of memory devices.

Figure 5A:
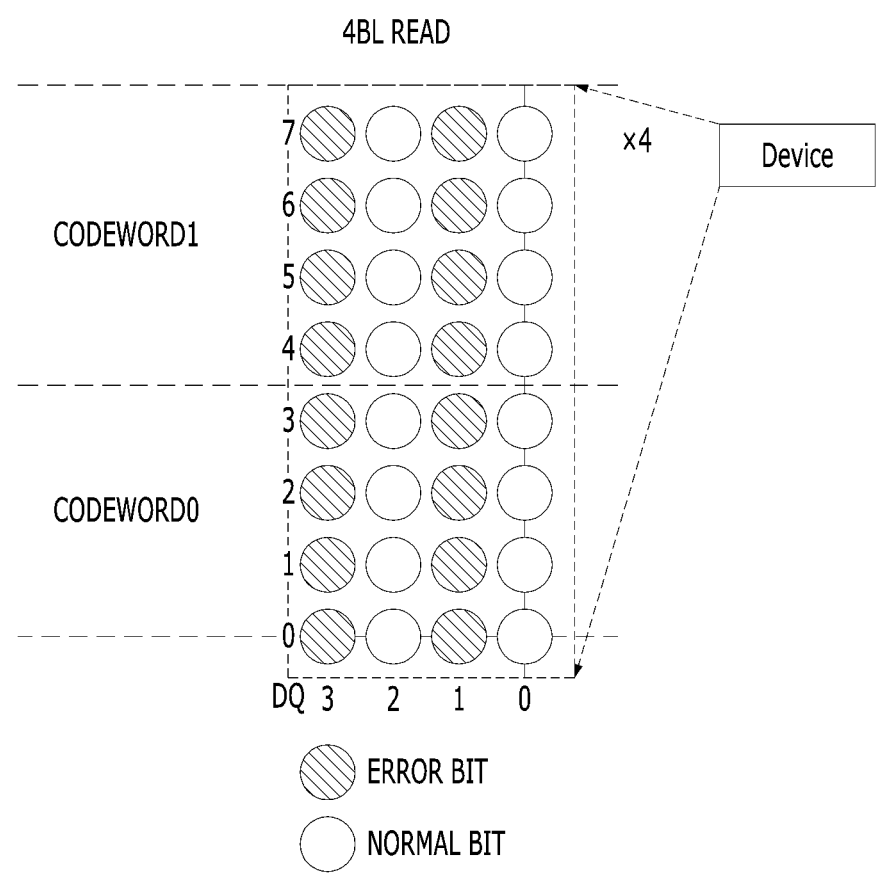

Referring to FIG. 5A, 32-bit data for one memory device are divided into 16-bit data corresponding to two codeword units Codeword0 and Codeword1, respectively, as described with reference to FIG. 4, and then read through four data I/O terminals (×4) DQ<0:3>. FIG. 5A shows that error bits ERROR BIT occurred in data read through specific data input/output terminals, for example, first and third data I/O terminals DQ<1, 3>. That is, the occurrence cause of the error bits is not included in FIG. 5A, but the error bits occurred in the data read through the specific data I/O terminals. Thus, the error bits ERROR BIT are across the two codeword units Codeword0 and Codeword1.

Figure 5B:
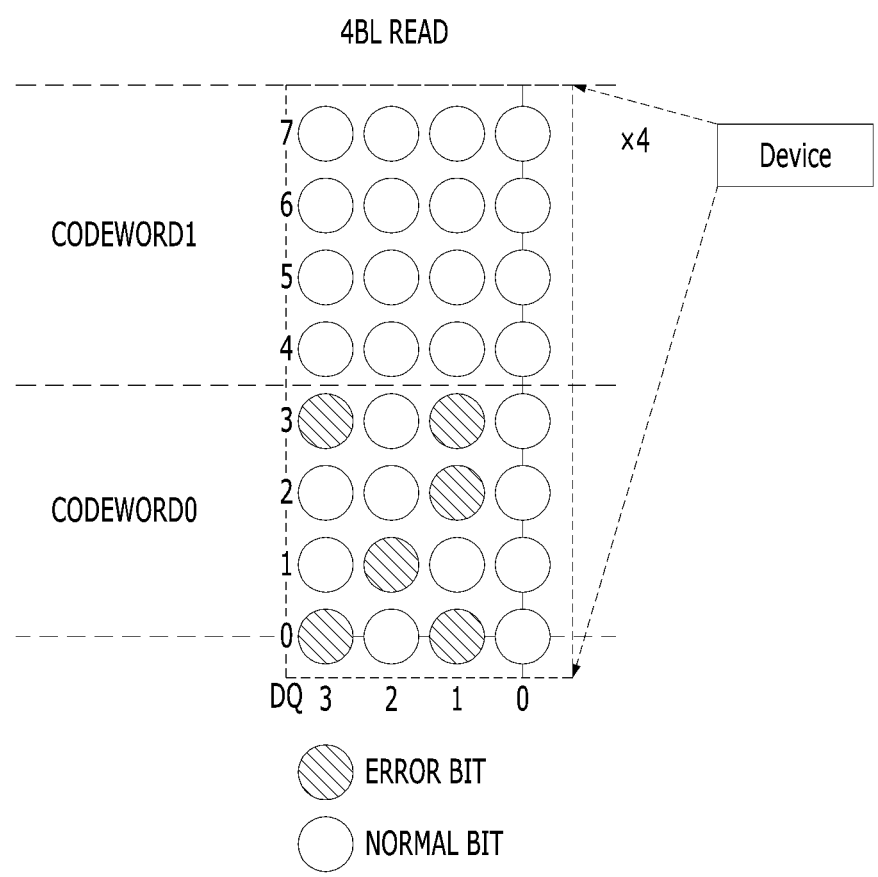

Referring to FIG. 5B, 32-bit data for one memory device are divided into 16-bit data corresponding to the two codeword units Codeword0 and Codeword1, respectively, and then read through the four data input/output terminals (×4) DQ<0:3>, as in FIG. 5A. FIG. 5B shows that error bits ERROR BIT occurred in the read data included in the first codeword unit Codeword0, but no error bits occurred in the read data included in the second codeword unit Codeword1. That is, the occurrence cause of the errors is not included in FIG. 5B, but the error bits ERROR BIT are included in only one codeword unit Codeword0, and are not across the two codeword units Codeword0 and Codeword1.

Referring back to FIGS. 1A, 2 and 3, operation K30 of additionally analyzing the log information LOG_INFO on 'the second memory device' decided as the first error rank by the second error analysis unit 1024 and checking whether errors occurring in 'the second memory device' are across codeword units, the number of which is equal to or more than the third reference number, may indicate an operation of checking whether the errors which occurred in 'the second memory device' are across two codeword units as illustrated in FIG. 5A or are included in only one codeword unit as illustrated in FIG. 5B, under the supposition that the third reference number is set to 2.

When the check result of operation K30 indicates that the errors which occurred in 'the second memory device' are across codeword units, the number of which is equal to or more than the third reference number (YES in operation K30), the second error analysis unit 1024 may check whether a total number of error bits across the codeword units, the number of which is equal to or more than the third reference number, is equal to or more than a fourth reference number in operation K40. For example, since the total number of the error bits across the two codeword units Codeword0 and Codeword1 is 16 as illustrated in FIG. 5A under the supposition that the fourth reference number is set to 8, the total number of the error bits may be equal to or more than the fourth reference number set to 8.

When the check result of operation K40 indicates that the total number of error bits across codeword units, the number of which is equal to or more than the third reference number, is equal to or more than the fourth reference number (YES in operation K40) while the errors which occurred in 'the second memory device' are across codeword units, the number of which is equal to or more than the third reference number (YES in operation K30), the second error analysis unit 1024 may assign a first error correcting strength to 'the second memory device', and classify the corresponding memory device as 'a fourth memory device' in operation K50. The counter-error operation unit 1025 may perform a first counter-error operation on the memory device to which the first error correcting strength is assigned and which is classified as 'the fourth memory device', in operation K60.

When the check result of operation K30 indicates that the errors which occurred in 'the second memory device' are included only in a codeword unit less than the third reference number (NO in operation K30), the second error analysis unit 1024 may assign a second error correcting strength to 'the second memory device', and classify the corresponding memory device as 'the fifth memory device' in operation K70. The counter-error operation unit 1025 may perform the second counter-error operation on the memory device to which the second error correcting strength is assigned and which is classified as 'the fifth memory device', in operation K80.

The operation of the second error analysis unit 1024 will be described as follows.

First, as described with reference to FIG. 2, it has been assumed that the first error analysis unit 1023 classified the memory device 1501 among the plurality of memory devices 1501 to 1508 as 'the second memory device' by deciding the error rank of the memory device 1501 as the first error rank, and did not decide the error ranks of the other memory devices 1502 to 1508, and there was no memory device whose error rank is decided as the second error rank and which is classified as 'the third memory device'.

The second error analysis unit 1024 may assign the second error correcting strength to the memory device whose error rank is not decided as the first error rank by the first error analysis unit 1023 (NO in operation K10), i.e. the memory device whose error rank is not decided and 'the third memory device' whose error rank is decided as the second error rank, and classify the memory device as 'the fifth memory device' in operation K70. Therefore, the second error analysis unit 1024 may assign the second error correcting strength to the other memory devices 1502 to 1508 whose error ranks are not decided, and classify the other memory devices 1502 to 1508 as 'the fifth memory devices' in operation K70.

In the case of the memory device whose error rank is decided as the first error rank by the first error analysis unit 1023 (YES in operation K10), i.e. 'the second memory device' whose error rank is decided as the first error rank, the second error analysis unit 1024 may check the form and number of the errors by additionally analyzing the log information LOG_INFO and the error correction information ERR_CO_INFO, and then decide an error correcting strength. Therefore, the second error analysis unit 1024 may check the form and number of errors by additionally analyzing the log information LOG_INFO and the error correction information ERR_CO_INFO on the memory device 1501 whose error rank is decided as the first error rank and which is classified as 'the second memory device', and then decide an error correcting strength.

Specifically, the second error analysis unit 1024 may additionally analyze the log information LOG_INFO and the error correction information ERR_CO_INFO on the memory device 1501 and check whether the errors are across codeword units, the number of which is equal to or more than the third reference number, in operation K30. The check result may indicate that the errors which occurred in the memory device 1501 are across codeword units, the number of which is equal to or more than the third reference number (YES in operation K30). Therefore, the second error analysis unit 1024 may check whether the total number of error bits contained in the errors across codeword units, the number of which is equal to or more than the third reference number in the memory device 1501, is equal to or more than the fourth reference number, in operation K40. The check result may indicate that the total number of error bits across the codeword units, the number of which is equal to or more than the third reference number in the memory device 1501, is equal to or more than the fourth reference number (YES in operation K40). Therefore, the second error analysis unit 1024 may classify the memory device 1501 as 'the fourth memory device' by assigning the first error correcting strength to the memory device 1501 in operation K60.

The counter-error operation unit 1025 included in the host 102 may perform different counter-error operations on the respective memory devices 1501 to 1508 according to the error correcting strengths for the memory devices 1501 to 1508, decided by the second error analysis unit 1024.

Specifically, the counter-error operation unit 1025 may perform the first counter-error operation on the memory device which the second error analysis unit 1024 has classified as 'the fourth memory device' by assigning the first error correcting strength, among the plurality of memory devices 1501 to 1508. Furthermore, the counter-error operation unit 1025 may perform the second counter-error operation on the memory device which the second error analysis unit 1024 has classified as 'the fifth memory device' by assigning the second error correcting strength, among the plurality of memory devices 1501 to 1508.

The first counter-error operation may include one or more operations among the following operations.

The first operation is an operation of selecting an area where the errors occurred in the memory device classified as 'the fourth memory device', and blocking access to the selected area. For example, the counter-error operation unit 1025 may select a specific block, word line or bit line in the memory device 1501 classified as 'the fourth memory device', and block access to the selected block, word line or bit line. The counter-error operation unit 1025 may copy data stored in the specific block, word line or bit line which is the access blocking target, store the copied data in 'another area', and then perform the access blocking operation. Here, 'another area' may indicate another normal block, normal word line or normal bit line of the memory device 1501. Furthermore, 'another area' may indicate another normal block, normal word line or normal bit line included in the other memory devices 1502 to 1508, instead of the memory device 1501. For reference, the reason why the operation of storing the data stored in the specific block, word line or bit line, which is the access blocking target, in 'another area' can be normally performed is because the specific block, word line or bit line is only selected as the access blocking target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The second operation is an operation of selecting an area where the errors occurred in the memory device classified as 'the fourth memory device', and repairing the selected area. For example, the counter-error operation unit 1025 may repair a specific block, word line or bit line in the memory device 1501 classified as 'the fourth memory device', with another normal redundancy block, redundancy word line or redundancy bit line. The host 102 may stop access to the memory device 1501 until the repair operation for the memory device 1501 corresponding to the repair target is completed. The memory device 1501 which is the repair target may copy the data, stored in the specific block, word line or bit line set to the repair target, into the information storage area PA1 therein, and then perform the repair operation. After the repair operation is completed, the memory device 1501 may recover the data copied in the information storage area PA1 into the redundancy block, redundancy word line or redundancy bit line. For reference, the reason why the operation of copying the data, stored in the specific block, word line or bit line set to the repair target, in the information storage area PA1 can be normally performed is because the specific block, word line or bit line is only selected as the repair target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The third operation is an operation of selecting an area where the errors occurred in the memory device classified as 'the fourth memory device', and disabling the selected area. For example, the counter-error operation unit 1025 may disable a specific block, word line or bit line in the memory device 1501 classified as 'the fourth memory device'. The memory device 1501 which is the disabling target may copy data stored in the specific block, word line or bit line set to the disabling target, store the copied data in 'another area', and inform the host 102 that the data were moved to 'another area. Here, 'another area' may indicate another normal block, word line or bit line of the memory device 1501. Furthermore, 'another area' may indicate another normal block, word line or bit line included in the other memory devices 1502 to 1508, instead of the memory device 1501. For reference, the reason why the operation of storing the data, stored in the specific block, word line or bit line set to the disabling target, into 'another area' can be normally performed is because the specific block, word line or bit line is only selected as the disabling target since it is expected that an unrecoverable error is highly likely to occur in the specific block, word line or bit line at the near future point of time, and the specific block, word line or bit line is normally operated or only a recoverable error occurs at the current point of time.

The second counter-error operation may include an error correction operation which uses an ECC for codeword-based data in which an error occurs, and is performed through the host ECC unit 1026, when the error occurs during an access operation for the memory device classified as 'the fifth memory device'.

FIGS. 1B and 2 show the method in which the data processing system analyzes the log information LOG_INFO and the error correction information ERR_CO_INFO, and decides the error ranks of the respective memory devices 1501 to 1508.

Specifically, when errors occurring during access operations performed by the plurality of memory devices 1501 to 1508, for example, data read/write operations, are corrected through operations of the memory ECC units ECC1 to ECC8 included in the plurality of memory devices 1501 to 1508, the plurality of memory devices 1501 to 1508 may generate log information LOG_INFO on the data whose errors have been corrected by the memory ECC units ECC1 to ECC8.

When errors are corrected by the system ECC unit 1306 included in the controller 130 during the access operations for the respective memory devices 1501 to 1508, for example, data read operations, the controller 130 may generate the error correction information ERR_CO_INFO on the data whose errors are corrected by the system ECC unit 1306.

The controller 130 may collect and analyze the log information LOG_INFO and the error correction information ERR_CO_INFO. That is, the controller 130 may decide error ranks and error correcting strengths for the respective memory devices 1501 to 1508.

The first error analysis unit 1303 included in the controller 130 may analyze the log information LOG_INFO and the error correction information ERR_CO_INFO collected by the error information collection unit 1301, check a memory device in which the number of errors occurring therein is equal to or more than a first reference number, among the plurality of memory devices 1501 to 1508, and classify the corresponding memory device as 'a first memory device' in step S10.

For example, suppose that the number of errors corrected by the system ECC unit 1306 or the memory ECC units ECC1 to ECC8 during an access process for the memory device 1501 among the plurality of memory devices 1501 to 1508 is 12, and the number of errors corrected by the system ECC unit 1306 or the memory ECC units ECC1 to ECC8 during access processes for the other memory devices 1502 to 1508 is less than 10. Furthermore, suppose that the first reference number is 10. In this case, the first error analysis unit 1303 may classify the memory device 1501 as 'the first memory device', and not decide error ranks of the other memory devices 1502 to 1508.

Specifically, the first error analysis unit 1303 may analyze the log information LOG_INFO and the error correction information ERR_CO_INFO, and check the types of the errors which occurred in the memory device classified as 'the first memory device' (YES in step S10). The first error analysis unit 1303 may sort the errors, which occurred in the memory device classified as 'the first memory device', into an error occurring in word line units in step S20, an error occurring in single bit units in step S30, an error occurring in bit line units in step S40, and the other errors in step S50.

The error occurring in word line units in step S20 may indicate that two or more errors occurring in the memory device classified as 'the first memory device' occur in the same word line within the same bank. The error occurring in single bit units in step S30 may indicate that one or no error occurs in the same word line and the same bit line. The error occurring in bit line units in step S40 may indicate that two or more errors occurring in the memory device classified as 'the first memory device' occur in the same bit line. The other errors in step S50 may indicate that two or more errors occurring in the memory device classified as 'the first memory device' have no specific distribution. For example, the other errors in step S50 may indicate errors other than those that occurred in word line units, single bit units or bit line units.

When the result obtained by checking the types of the errors which occurred in the memory device classified as 'the first memory device' indicates that the errors are errors occurring in word line units in step S20, the first error analysis unit 1303 may count the number of errors which occurred in the same word line in the memory device classified as 'the first memory device', in step S60. When the number of errors counted is equal to or more than a second reference number (YES in step S70), the first error analysis unit 1303 may classify the corresponding memory device as 'a second memory device' by deciding the error rank of the memory device as a first error rank in step S90. When the number of errors counted is less than the second reference number (NO in step S70), the first error analysis unit 1303 may classify the corresponding memory device as 'a third memory device' by deciding the error rank of the memory device as a second error rank, in step S80.

When the result obtained by checking the types of the errors which occurred in the memory device classified as 'the first memory device' indicates that the errors are errors occurring in single bit units (YES in step S30), errors occurring in bit line units (YES in step S40), and the other errors (YES in step S50), the first error analysis unit 1303 may classify the corresponding memory device as 'the third memory device' by deciding the error rank of the memory device as the second error rank, in step S80.

For example, suppose that the errors which occurred in the memory device 1501 classified as 'the first memory device' are errors occurring in word line units, and the number of errors which occurred in the same word line is equal to or more than the second reference number. In this case, the first error analysis unit 1303 may classify the memory device 1501, classified as 'the first memory device', as 'the second memory device' by deciding the error rank of the memory device 1501 as the first error rank.

Referring to FIGS. 1B, 2 and 3, the second error analysis unit 1304 included in the controller 130 may select some of the plurality of memory devices 1501 to 1508 according to the error ranks of the respective memory devices 1501 to 1508, decided by the first error analysis unit 1303. For the some memory devices selected among the plurality of memory devices 1501 to 1508, the second error analysis unit 1304 may decide error correcting strengths by checking the forms and numbers of the errors through additional analysis of the log information LOG_INFO and the error correction information ERR_CO_INFO. For the other memory devices except the selected memory devices, the second error analysis unit 1304 may decide error correcting strengths corresponding to the error ranks decided by the first error analysis unit 1303.

Specifically, the first error analysis unit 1303 has classified the plurality of memory devices 1501 to 1508 into a memory device whose error rank is not decided, 'the second memory device' whose error rank is decided as the first error rank, and 'the third memory device' whose error rank is decided as the second error rank.

The second error analysis unit 1304 may check whether the error rank decided by the first error analysis unit 1303 is the first error rank, in operation K10.

When the check result of operation K10 indicates that the error rank decided by the first error analysis unit 1303 is not the first error rank (NO in operation K10) or the corresponding memory device is a memory device whose error rank is not decided or 'the third memory device' whose error rank is decided as the second error rank, the second error analysis unit 1304 may classify the corresponding memory device as 'a fifth memory device' by assigning a second error correcting strength to the memory device, in operation K70. The counter-error operation unit 1305 may perform a second counter-error operation on the memory device to which the second error correcting strength is assigned and which is classified as 'the fifth memory device', in operation K80.

When the check result of operation K10 indicates that the error rank decided by the first error analysis unit 1303 is the first error rank (YES in operation K10) or the memory device is 'the second memory device' whose error rank is decided as the first error rank, the second error analysis unit 1304 may check the form and number of errors by additionally analyzing the log information LOG_INFO and the error correction information ERR_CO_INFO, and then decide an error correcting strength. Specifically, the second error analysis unit 1304 may additionally analyze the log information LOG_INFO and the error correction information ERR_CO_INFO on 'the second memory device' whose error rank is decided as the first error rank, and check whether the errors which occurred in 'the second memory device' are across codeword units, a number of which is equal to or more than a third reference number, in operation K30.

The meaning of the operation of checking errors across codeword units has been already described with reference to FIGS. 1A, 4, 5A and 5B. Therefore, the detailed description thereof will be omitted herein.

Furthermore, operation K30 of additionally analyzing the log information LOG_INFO on 'the second memory device' decided as the first error rank by the second error analysis unit 1304 and checking whether errors occurring in 'the second memory device' are across codeword units, the number of which is equal to or more than the third reference number, may indicate an operation of checking whether the errors which occurred in 'the second memory device' are across two codeword units as illustrated in FIG. 5A or are included in only one codeword unit as illustrated in FIG. 5B, under the supposition that the third reference number is set to 2.

When the check result of operation K30 indicates that the errors which occurred in 'the second memory device' are across codeword units, the number of which is equal to or more than the third reference number (YES in operation K30), the second error analysis unit 1304 may check whether the total number of error bits across the codeword units, the number of which is equal to or more than the third reference number, is equal to or more than a fourth reference number, in operation K40. For example, since the total number of the error bits across the two codeword units Codeword0 and Codeword1 is 16 as illustrated in FIG. 5A under the supposition that the fourth reference number is set to 8, the total number of error bits may be equal to or more than the fourth reference number set to 8.

When the check result of operation K40 indicates that total number of error bits across codeword units, the number of which is equal to or more than the third reference number, is equal to or more than the fourth reference number (YES in operation K40) while the errors which occurred in 'the second memory device' are across codeword units, the number of which is equal to or more than the third reference number (YES in operation K30), the second error analysis unit 1304 may assign a first error correcting strength to 'the second memory device', and classify the corresponding memory device as 'a fourth memory device', in operation K50. The counter-error operation unit 1305 may perform a first counter-error operation on the memory device to which the first error correcting strength is assigned and which is classified as 'the fourth memory device', in operation K60.

When the check result of operation K30 indicates that the errors which occurred in 'the second memory device' are included only in a codeword unit less than the third reference number (NO in operation K30), the second error analysis unit 1304 may assign a second error correcting strength to 'the second memory device', and classify the corresponding memory device as 'the fifth memory device' in operation K70. The counter-error operation unit 1305 may perform a second counter-error operation on the memory device to which the second error correcting strength is assigned and which is classified as 'the fifth memory device', in operation K80.

The operation of the second error analysis unit 1304 will be described as follows.

First, as described with reference to FIG. 2, it has been assumed that the first error analysis unit 1303 classified the memory device 1501 among the plurality of memory devices 1501 to 1508 as 'the second memory device' by deciding the error rank of the memory device 1501 as the first error rank, and did not decide the error ranks of the other memory devices 1502 to 1508, and there was no memory device whose error rank is decided as the second error rank and which is classified as 'the third memory device'.

The second error analysis unit 1304 may assign the second error correcting strength to the memory device whose error rank is not decided as the first error rank by the first error analysis unit 1303 (NO in operation K10), i.e. the memory device whose error rank is not decided and 'the third memory device' whose error rank is decided as the second error rank, and classify the memory device as 'the fifth memory device', in operation K70. Therefore, the second error analysis unit 1304 may assign the second error correcting strength to the other memory devices 1502 to 1508 whose error ranks are not decided, and classify the other memory devices 1502 to 1508 as 'the fifth memory devices', in operation K70.

In the case of the memory device whose error rank is decided as the first error rank by the first error analysis unit 1303 (YES in operation K10), i.e. 'the second memory device' whose error rank is decided as the first error rank, the second error analysis unit 1304 may check the form and number of the errors by additionally analyzing the log information LOG_INFO and the error correction information ERR_CO_INFO, and then decide an error correcting strength. Therefore, the second error analysis unit 1304 may check the form and number of errors by additionally analyzing the log information LOG_INFO and the error correction information ERR_CO_INFO on the memory device 1501 whose error rank is decided as the first error rank and which is classified as 'the second memory device', and then decide an error correcting strength.

Specifically, the second error analysis unit 1304 may additionally analyze the log information LOG_INFO and the error correction information ERR_CO_INFO on the memory device 1501 and check whether the errors are across codeword units, the number of which is equal to or more than the third reference number, in operation K30. The check result may indicate that the errors which occurred in the memory device 1501 are across codeword units, the number of which is equal to or more than the third reference number (YES in operation K30). Therefore, the second error analysis unit 1304 may check whether the total number of error bits contained in the errors across codeword units, the number of which is equal to or more than the third reference number in the memory device 1501, is equal to or more than the fourth reference number, in operation K40. The check result may indicate that the number of errors across the codeword units, the number of which is equal to or more than the third reference number in the memory device 1501, is equal to or more than the fourth reference number (YES in operation K40). Therefore, the second error analysis unit 1304 may classify the memory device 1501 as 'the fourth memory device' by assigning the first error correcting strength to the memory device 1501 in operation K60.

The counter-error operation unit 1305 included in the controller 130 may perform different counter-error operations on the respective memory devices 1501 to 1508 according to the error correcting strengths for the memory devices 1501 to 1508, decided by the second error analysis unit 1304.

Specifically, the counter-error operation unit 1305 may perform the first counter-error operation on the memory device which the second error analysis unit 1304 has classified as 'the fourth memory device' by assigning the first error correcting strength, among the plurality of memory devices 1501 to 1508. Furthermore, the counter-error operation unit 1305 may perform the second counter-error operation on the memory device which the second error analysis unit 1304 has classified as 'the fifth memory device' by assigning the second error correcting strength, among the plurality of memory devices 1501 to 1508.

The first counter-error operation may include one or more operations among the following operations.

The first operation is an operation of selecting an area where the errors occurred in the memory device classified as 'the fourth memory device', and blocking access to the selected area. For example, the counter-error operation unit 1305 may select a specific block, word line or bit line in the memory device 1501 classified as 'the fourth memory device', and block access to the selected block, word line or bit line. The counter-error operation unit 1305 may copy data stored in the specific block, word line or bit line which is the access blocking target, store the copied data in 'another area', and then perform the access blocking operation. Here, 'another area' may indicate another normal block, normal word line or normal bit line of the memory device 1501. Furthermore, 'another area' may indicate another normal block, normal word line or normal bit line included in the other memory devices 1502 to 1508, instead of the memory device 1501. For reference, the reason why the operation of storing the data stored in the specific block, word line or bit line, which is the access blocking target, in 'another area' can be normally performed is because the specific block, word line or bit line is only selected as the access blocking target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The second operation is an operation of selecting an area where the errors occurred in the memory device classified as 'the fourth memory device', and repairing the selected area.

For example, the counter-error operation unit 1305 may repair a specific block, word line or bit line in the memory device 1501 classified as 'the fourth memory device', with another normal redundancy block, redundancy word line or redundancy bit line. The controller 130 may stop access to the memory device 1501 until the repair operation for the memory device 1501 corresponding to the repair target is completed. The memory device 1501 which is the repair target may copy the data, stored in the specific block, word line or bit line set to the repair target, into the information storage area PA1 therein, and then perform the repair operation. After the repair operation is completed, the memory device 1501 may restore the data copied in the information storage area PA1 into the redundancy block, redundancy word line or redundancy bit line which has been completely repaired. For reference, the reason why the operation of copying the data, stored in the specific block, word line or bit line set to the repair target, in the information storage area PA1 can be normally performed is because the specific block, word line or bit line is only selected as the repair target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The third operation is an operation of selecting an area where the errors occurred in the memory device classified as 'the fourth memory device', and disabling the selected area. For example, the counter-error operation unit 1305 may disable a specific block, word line or bit line in the memory device 1501 classified as 'the fourth memory device'. The memory device 1501 which is the disabling target may copy data stored in the specific block, word line or bit line set to the disabling target, store the copied data in 'another area', and inform the controller 130 that the data were moved to 'another area. Here, 'another area' may indicate another normal block, word line or bit line of the memory device 1501. Furthermore, 'another area' may indicate another normal block, word line or bit line included in the other memory devices 1502 to 1508, instead of the memory device 1501. For reference, the reason why the operation of storing the data, stored in the specific block, word line or bit line set to the disabling target, into 'another area' can be normally performed is because the specific block, word line or bit line is only selected as the disabling target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The second counter-error operation may include an error correction operation which uses an ECC for codeword-based data in which an error occurs, and is performed through the system ECC unit 1306, when the error occurs during an access operation for the memory device classified as 'the fifth memory device'.

FIGS. 1C and 2 show the method in which the memory system analyzes the log information LOG_INFO, and decides the error ranks of the respective memory devices 1501 to 1508.

Specifically, when errors which occurred during access operations performed by the plurality of memory devices 1501 to 1508, for example, data read/write operations, are corrected through operations of the memory ECC unit 1506 included in the plurality of memory devices 1501 to 1508, the plurality of memory devices 1501 to 1508 may generate log information LOG_INFO on the data whose errors have been corrected by the memory ECC unit 1506.

The error information collection unit 1511 and the error analysis unit 1513 may collect and analyze the log information LOG_INFO. That is, the error information collection unit 1511 and the error analysis unit 1513 may decide error ranks for the respective memory devices 1501 to 1508.

Specifically, the error analysis unit 1513 may analyze the log information LOG_INFO collected by the error information collection unit 1511, check a memory device in which the number of errors occurring therein is equal to or more than a first reference number, among the plurality of memory devices 1501 to 1508, and classify the corresponding memory device as 'a first memory device' in step S10.

For example, suppose that the number of errors corrected by the memory ECC unit 1516 during an access process for the memory device 1501 among the plurality of memory devices 1501 to 1508 is 12, and the number of errors corrected by the memory ECC unit 1516 during access processes for the other memory devices 1502 to 1508 is less than 10. Furthermore, suppose that the first reference number is 10. In this case, the error analysis unit 1513 may classify the memory device 1501 as 'the first memory device', and not decide error ranks of the other memory devices 1502 to 1508.

More specifically, the error analysis unit 1513 may analyze the log information LOG_INFO and the error correction information ERR_CO_INFO, and check the types of the errors which occurred in the memory device classified as 'the first memory device' (YES in step S10). The error analysis unit 1513 may sort the errors, which occurred in the memory device classified as 'the first memory device', into an error occurring in word line units in step S20, an error occurring in single bit units in step S30, an error occurring in bit line units in step S40, and the other errors in step S50.

The error occurring in word line units in step S20 may indicate that two or more errors occurring in the memory device classified as 'the first memory device' occur in the same word line within the same bank. The error occurring in single bit units in step S30 may indicate that one or no error occurs in the same word line and the same bit line. The error occurring in bit line units in step S40 may indicate that two or more errors occurring in the memory device classified as 'the first memory device' occur in the same bit line. The other errors in step S50 may indicate that two or more errors occurring in the memory device classified as 'the first memory device' have no specific distribution. For example, the other errors in step S50 may indicate errors other than errors that occurred in word line units, single bit units or bit line units.

When the result obtained by checking the types of the errors which occurred in the memory device classified as 'the first memory device' indicates that the errors are errors occurring in word line units in step S20, the error analysis unit 1513 may count the number of errors which occurred in the same word line in the memory device classified as 'the first memory device', in step S60. When the number of errors counted is equal to or more than a second reference number (YES in step S70), the error analysis unit 1513 may classify the corresponding memory device as 'a second memory device' by deciding the error rank of the memory device as a first error rank in step S90. When the number of errors counted is less than the second reference number (NO in step S70), the error analysis unit 1513 classify the corresponding memory device as 'a third memory device' by deciding the error rank of the memory device as a second error rank, in step S80.

When the result obtained by checking the types of the errors which occurred in the memory device classified as 'the first memory device' indicates that the errors are errors occurring in single bit units (YES in step S30), errors occurring in bit line units (YES in step S40), and the other errors (YES in step S50), the error analysis unit 1513 may classify the corresponding memory device as 'the third memory device' by deciding the error rank of the memory device as the second error rank, in step S80.

For example, suppose that the errors which occurred in the memory device 1501 classified as 'the first memory device' are errors occurring in word line units, and the number of errors which occurred in the same word line is equal to or more than the second reference number. In this case, the error analysis unit 1513 may classify the memory device 1501, classified as 'the first memory device', as 'the second memory device' by deciding the error rank of the memory device 1501 as the first error rank.

The counter-error operation unit 1515 may perform different counter-error operations on the respective memory devices 1501 to 1508 according to the error ranks of the memory devices 1501 to 1508, decided by the error analysis unit 1513.

Specifically, the counter-error operation unit 1515 may perform the first counter-error operation on the memory device which the error analysis unit 1513 has classified as 'the second memory device' by assigning the first error rank, among the plurality of memory devices 1501 to 1508. Furthermore, the counter-error operation unit 1515 may perform the second counter-error operation on the memory device which the error analysis unit 1513 has classified as 'the third memory device' by assigning the second error rank, among the plurality of memory devices 1501 to 1508.

The first counter-error operation may include one or more operations among the following operations.

The first operation is an operation of selecting an area where the errors occurred in the memory device classified as 'the second memory device', and blocking access to the selected area. For example, the counter-error operation unit 1515 may select a specific block, word line or bit line in the memory device 1501 classified as 'the second memory device', and block access to the selected block, word line or bit line. The counter-error operation unit 1515 may copy data stored in the specific block, word line or bit line which is the access blocking target, store the copied data in 'another area', and then perform the access blocking operation. Here, 'another area' may indicate another normal block, normal word line or normal bit line of the memory device 1501. Furthermore, 'another area' may indicate another normal block, normal word line or normal bit line included in the other memory devices 1502 to 1508, instead of the memory device 1501. For reference, the reason why the operation of storing the data stored in the specific block, word line or bit line, which is the access blocking target, in 'another area' can be normally performed is because the specific block, word line or bit line is only selected as the access blocking target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The second operation is an operation of selecting an area where the errors occurred in the memory device classified as 'the second memory device', and repairing the selected area. For example, the counter-error operation unit 1515 may repair a specific block, word line or bit line in the memory device 1501 classified as 'the second memory device', with another normal redundancy block, redundancy word line or redundancy bit line. The access to the memory device 1501 may be stopped during a period in which the repair operation is performed. The memory device 1501 which is the repair target may copy the data, stored in the specific block, word line or bit line set to the repair target, into the information storage area PA1 therein, and then perform the repair operation. After the repair operation is completed, the memory device 1501 may restore the data copied in the information storage area PA1 into the redundancy block, redundancy word line or redundancy bit line which has been completely repaired. For reference, the reason why the operation of copying the data, stored in the specific block, word line or bit line set to the repair target, in the information storage area PA1 can be normally performed is because the specific block, word line or bit line is only selected as the repair target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The third operation is an operation of selecting an area where the errors occurred in the memory device classified as 'the second memory device', and disabling the selected area. For example, the counter-error operation unit 1515 may disable a specific block, word line or bit line in the memory device 1501 classified as 'the second memory device'. The counter-error operation unit 1515 may copy data stored in the specific block, word line or bit line set to the disabling target, and store the copied data in 'another area'. Here, 'another area' may indicate another normal block, word line or bit line of the memory device 1501. Furthermore, 'another area' may indicate another normal block, word line or bit line included in the other memory devices 1502 to 1508, instead of the memory device 1501. For reference, the reason why the operation of storing the data, stored in the specific block, word line or bit line set to the disabling target, into 'another area' can be normally performed is because the specific block, word line or bit line is only selected as the disabling target since it is expected that an unrecoverable error is highly likely to occur in the specific block, word line or bit line at the near future point of time, and the specific block, word line or bit line is normally operated or only a recoverable error occurs in the specific block, word line or bit line, at the current point of time.

The second counter-error operation may include an error correction operation which uses an ECC for codeword-based data in which an error occurs, and is performed through the memory ECC unit 1516, when the error occurs during an access operation for the memory device classified as 'the third memory device'.

Any element designated as a "unit" herein may be implemented with appropriate circuitry, i.e., hardware, or combination of hardware and software and/or firmware.

Although various embodiments have been illustrated and described, it will be apparent to those skilled in the art that various changes and modifications may be made without departing from the spirit and scope of the invention as defined in the following claims.

What is claimed is:

1. A data processing system comprising:
a memory system comprising a plurality of memory devices, each of which comprises a first error correction unit and a plurality of cell array regions each having a plurality of memory cells coupled in an array to a plurality of word lines and a plurality of bit lines; and
a host comprising a second error correction unit for correcting an error of data transferred from the memory system, and suitable for generating error correction information on the error correction operation of the second error correction unit, setting error correcting strengths to the respective memory devices using the error correction information and log information generated by the memory devices, and performing counter-error operations on the respective memory devices according to the error correcting strengths,
wherein errors occurring in data accessed through access operations on the plurality of cell array regions are corrected by the first error correction unit,
wherein each of the memory devices generates the log information on the error correction operation of the first error correction unit, and
wherein the host comprises:
a first error analysis unit suitable for analyzing the log information and the error correction information, checking numbers and types of errors occurring in the respective memory devices, and deciding error ranks of the respective memory devices according to the check result; and
a second error analysis unit suitable for deciding error correcting strengths for some of the plurality of memory devices according to the error ranks by checking forms and the numbers of the errors through additional analysis of the log information and the error correction information, and deciding the error correcting strengths for remaining memory devices such that the error correcting strengths for the remaining memory devices correspond to the error ranks.

2. The data processing system of claim 1,
wherein each of the memory devices generates the log information by accumulating and storing error information of the data corrected by the first error correction unit in an information storage area therein, and
wherein each of the memory devices outputs the log information to the host through the memory system according to a request of the host.

3. The data processing system of claim 2, wherein the host further comprises:
an error information collection unit suitable for collecting the error correction information in real time or at set time points, and collecting the log information from the memory system at the set time points; and
a counter-error operation unit suitable for performing the counter-error operations on the respective memory devices according to the error correcting strengths.

4. The data processing system of claim 3,
wherein the first error analysis unit classifies, as a first memory device, a memory device in which the number of errors occurring therein is equal to or more than a first reference number among the plurality of memory devices,
wherein when the type of the errors occurring in the first memory device is a first error occurring in word lines equal to or more than a second reference number, the first error analysis unit classifies the first memory device as a second memory device having a first error rank, and
wherein when the type of the errors occurring in the first memory device is a different type of error from the first error, the first error analysis unit classifies the corresponding first memory device as a third memory device having a second error rank.

5. The data processing system of claim 4,
wherein each of the first and second error correction units performs an error correction operation on data, inputted to/outputted from each of the memory devices, in codeword units including an Error Correction Code (ECC),
wherein when the errors occurring in the second memory device are across the codeword units, a number of which is equal to or more than a third reference number, and a total number of error bits contained in the errors is equal to or more than a fourth reference number, the second error analysis unit classifies the corresponding second memory device as a fourth memory device having a first error correcting strength,
wherein when the errors occurring in the second memory device are across the codeword units, the number of which is equal to or more than the third reference number, and the total number of error bits contained in the errors is less than the fourth reference number or the errors are across the codeword units, the number of which is less than the third reference number, the second error analysis unit classifies the corresponding second memory device as a fifth memory device having a second error correcting strength, and
wherein the second error analysis unit classifies the third memory device as the fifth memory device by assigning the second error correcting strength to the third memory device.

6. The data processing system of claim 5,
wherein the counter-error operation unit selects, as the counter-error operation, any one of:
an operation of selecting and blocking access to an area where the errors occurred in the fourth memory device,
an operation of selecting and repairing the area where the errors occurred in the fourth memory device, and
an operation of selecting and disabling the area where the errors occurred in the fourth memory device, according to the state of the fourth memory device, and
wherein the counter-error operation unit performs the selected operation.

7. The data processing system of claim 3, wherein the host selects and performs any one of:
an operation of designating, as the set time points, time points spaced apart by a specific time interval starting from when power is supplied to the memory system,
an operation of counting the number of the errors occurring in the data during the access operations on the memory system, designating, as the set time points, each time point at which the counted number exceeds a fifth reference number, and
an operation of designating, as the set time points, each time point at which the time required for correcting the errors in the data accessed through the access operations is equal to or longer than a specific time.

8. A memory system comprising:
a plurality of memory devices each comprising a first error correction unit and a plurality of cell array regions each having a plurality of memory cells coupled in an array to a plurality of word lines and a plurality of bit lines, and suitable for correcting errors occurring in data accessed through access operations on the plurality of cell array regions through the first error correction unit, and generating log information on the error correction operation of the first error correction unit; and a controller comprising a second error correction unit for correcting errors of data transferred from the plurality of memory devices, and suitable for generating error correction information on the error correction operation of the second error correction unit, setting error correcting strengths to the respective memory devices using the log information and the error correction information, and performing counter-error operations on the respective memory devices according to the error correcting strengths, wherein the controller comprises:

a first error analysis unit suitable for analyzing the log information and the error correction information, checking numbers and types of errors occurring in the respective memory devices, and deciding error ranks of the respective memory devices according to the check result; and a second error analysis unit suitable for deciding error correcting strengths for some of the plurality of memory devices according to the error ranks by checking forms and the numbers of the errors through additional analysis of the log information and the error correction information, and deciding the error correcting strengths for remaining memory devices such that the error correcting strengths for the remaining memory devices correspond to the error ranks.

9. The memory system of claim 8, wherein each of the memory devices generates the log information by accumulating and storing error information of the data corrected by the first error correction unit in an information storage area therein, and wherein each of the memory devices outputs the log information to the controller according to a request of the controller.

10. The memory system of claim 9, wherein the controller further comprises:

an error information collection unit suitable for collecting the error correction information in real time or at set time points, and collecting the log information from each of the memory devices at the set time points; and a counter-error operation unit suitable for performing the counter-error operations on the respective memory devices according to the error correcting strengths.

11. The memory system of claim 10, wherein the first error analysis unit classifies, as a first memory device, a memory device in which the number of errors occurring therein is equal to or more than a first reference number, among the plurality of memory devices, wherein when the type of the errors occurring in the first memory device is a first error occurring in word lines equal to or more than a second reference number, the first error analysis unit classifies the corresponding first memory device as a second memory device having a first error rank, and wherein when the type of the errors occurring in the first memory device is a different type of error from the first error, the first error analysis unit classifies the corresponding first memory device as a third memory device having a second error rank.

12. The memory system of claim 11, wherein each of the first and second error correction units performs an error correction operation on data, inputted to/outputted from each of the memory devices, in codeword units including an Error Correction Code (ECC), wherein when errors occurring in the second memory device are across the codeword units, a number of which is equal to or more than a third reference number, and a total number of error bits contained in the errors is equal to or more than a fourth reference number, the second error analysis unit classifies the corresponding second memory device as a fourth memory device having a first error correcting strength, wherein when the errors occurring in the second memory device are across the codeword units, the number of which is equal to or more than the third reference number, and the total number of error bits contained in the errors is less than the fourth reference number or the errors are across the codeword units, the number of which is less than the third reference number, the second error analysis unit classifies the corresponding second memory device as a fifth memory device having a second error correcting strength, and wherein the second error analysis unit classifies the third memory device as the fifth memory device by assigning the second error correcting strength to the third memory device.

13. The memory system of claim 12, wherein the counter-error operation unit selects, as the counter-error operation, any one of:

an operation of selecting and blocking access to an area where the errors occurred in the fourth memory device, an operation of selecting and repairing the area where the errors occurred in the fourth memory device, and an operation of selecting and disabling the area where the errors occurred in the fourth memory device, according to the state of the fourth memory device, and wherein the counter-error operation unit performs the selected operation.

14. The memory system of claim 10, wherein the controller selects and performs any one of:

an operation of designating, as the set time points, time points spaced apart a specific time interval from when power is supplied to the memory system, an operation of counting the number of the errors occurring in the data during the access operations on the plurality of memory devices, designating, as the set time points, each time point at which the counted number exceeds a fifth reference number, and an operation of designating, as the set time points, each time point at which the time required for correcting the errors occurring in the data accessed through the access operations is equal to or longer than a specific time.

15. An operating method of a memory system which includes a plurality of memory devices each including an error correction unit and a plurality of cell array regions each having a plurality of memory cells coupled in an array to a plurality of word lines and a plurality of bit lines, the operating method comprising:

operating the error correction unit to correct errors occurring in data accessed through access operations on the plurality of cell array regions and generating log information on the error correction operation of the error correction unit;

analyzing the log information, checking numbers and types of errors occurring in the respective memory devices, and deciding error ranks of the respective memory devices according to the check result; and performing counter-error operations on the respective memory devices according to the error ranks, wherein the analyzing comprises:

classifying, as a first memory device, a memory device in which the number of errors occurring therein is equal to or more than a first reference number, among the plurality of memory devices;

classifying the first memory device as a second memory device having a first error rank, when the type of the errors occurring in the first memory device is a first error occurring in word lines equal to or more than a second reference number; and classifying the first memory device as a third memory device having a second error rank, when the type of the error occurring in the first memory device is a different type of error from the first error.

16. The operating method of claim 15, wherein the operating comprises:

operating the error correction unit to correct the errors occurring in the data accessed through the access operations on the plurality of cell array regions; and generating the log information by accumulating and storing error information for the data corrected by the error correction unit in information storage regions in the respective memory devices.

17. The operating method of claim 16, further comprising collecting the log information stored in the information storage region at each set time of time, and wherein the analyzing further comprises analyzing the log information collected in the collection step.

18. The operating method of claim 15, wherein the performing comprises performing any one of:

selecting and blocking access to an area where the errors occurred in the second memory device, selecting and repairing the area where the errors occurred in the second memory device, and selecting and disabling the area where the errors occurred in the second memory device, according to the state of the second memory device.

19. The operation method of claim 17, further comprising at least one of:

designating, as the set time points, time points spaced apart a specific time interval from when power is supplied to the memory system;

counting the number of errors occurring in the data during the access operations on the plurality of memory devices, designating, as the set time points, each time point at which the counted number exceeds a fifth reference number, and resetting the counted number; and designating, as the set time points, each time point at which the time required for correcting the errors occurring in the data accessed through the access operations is equal to or longer than a specific time.

* * * * *